US012557305B2

(12) United States Patent
Hsu et al.

(10) Patent No.: US 12,557,305 B2
(45) Date of Patent: Feb. 17, 2026

(54) INTEGRATED CHIP INDUCTOR STRUCTURE

(71) Applicant: Taiwan Semiconductor Manufacturing Company, Ltd., Hsin-Chu (TW)

(72) Inventors: Hung-Wen Hsu, Tainan (TW); Po-Han Huang, Tainan (TW); Wei-Li Huang, Pingtung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 404 days.

(21) Appl. No.: 18/354,842

(22) Filed: Jul. 19, 2023

(65) Prior Publication Data

US 2023/0361157 A1    Nov. 9, 2023

Related U.S. Application Data

(62) Division of application No. 16/884,319, filed on May 27, 2020, now Pat. No. 11,784,211.

(51) Int. Cl.
*H01L 27/08* (2006.01)
*H01F 27/02* (2006.01)
(Continued)

(52) U.S. Cl.
CPC ............. *H10D 1/20* (2025.01); *H01F 27/027* (2013.01); *H01F 27/06* (2013.01); *H01F 27/36* (2013.01);
(Continued)

(58) Field of Classification Search
CPC ...... H01F 27/36; H01F 41/0206; H01F 41/10; H01F 2017/0066; H01F 2017/008;
(Continued)

(56) References Cited

U.S. PATENT DOCUMENTS 9,449,898 B2 * 9/2016 Lin ................... H01L 21/76883
10,475,877 B1 * 11/2019 Hsu ......................... H01L 24/06
(Continued)

OTHER PUBLICATIONS

Wikipedia.org "Inductance." Published on Aug. 11, 2019.
(Continued)

*Primary Examiner* — Jarrett J Stark
(74) *Attorney, Agent, or Firm* — Eschweiler & Potashnik, LLC

(57) ABSTRACT

The present disclosure relates to, in part, an inductor structure that includes an etch stop layer arranged over an interconnect structure overlying a substrate. A magnetic structure includes a plurality of stacked layers is arranged over the etch stop layer. The magnetic structure includes a bottommost layer that is wider than a topmost layer. A first conductive wire and a second conductive wire extend in parallel over the magnetic structure. The magnetic structure is configured to modify magnetic fields generated by the first and second conductive wires. A pattern enhancement layer is arranged between the bottommost layer of the magnetic structure and the etch stop layer. The pattern enhancement layer has a first thickness, and the bottommost layer of the magnetic structure has a second thickness that is less than the first thickness.

20 Claims, 23 Drawing Sheets

(51) Int. Cl.
*H01F 27/06* (2006.01)
*H01F 27/36* (2006.01)
*H01F 41/02* (2006.01)
*H01F 41/10* (2006.01)
*H10D 1/20* (2025.01)

(52) U.S. Cl.
CPC ......... *H01F 41/0206* (2013.01); *H01F 41/10* (2013.01)

(58) Field of Classification Search
CPC ......... H01F 2017/0086; H01F 17/0013; H01F 41/046; H01L 23/5227; H01L 21/768; H01L 23/528; H01L 23/532
See application file for complete search history.

(56) References Cited

U.S. PATENT DOCUMENTS

| | | | | |
|---|---|---|---|---|
| 10,720,487 | B2* | 7/2020 | Ku | H10D 1/20 |
| 10,756,162 | B2 | 8/2020 | Chen et al. | |
| 10,868,106 | B2* | 12/2020 | Huang | H01L 21/32134 |
| 11,430,606 | B2* | 8/2022 | Cappabianca | H10D 1/20 |
| 2004/0099908 | A1 | 5/2004 | Durlam et al. | |
| 2008/0003760 | A1* | 1/2008 | Gardner | H01F 10/265 |
| | | | | 257/E21.022 |
| 2015/0035159 | A1* | 2/2015 | Lin | H01L 21/76883 |
| | | | | 257/762 |
| 2018/0005740 | A1 | 1/2018 | Doris et al. | |
| 2018/0204902 | A1* | 7/2018 | Huang | H01L 21/32134 |
| 2019/0027553 | A1* | 1/2019 | Huang | H01L 21/32134 |
| 2019/0267445 | A1 | 8/2019 | Huang et al. | |
| 2020/0006464 | A1 | 1/2020 | Brown et al. | |
| 2020/0075448 | A1 | 3/2020 | Chen et al. | |
| 2020/0075708 | A1* | 3/2020 | Chen | H01L 24/32 |
| 2020/0127078 | A1 | 4/2020 | Tzeng et al. | |
| 2021/0098371 | A1* | 4/2021 | Hsu | H01L 23/5227 |
| 2021/0376053 | A1* | 12/2021 | Hsu | H10D 1/20 |
| 2024/0047508 | A1* | 2/2024 | Chen | H10D 1/20 |
| 2025/0169084 | A1* | 5/2025 | Chen | H10D 1/20 |

OTHER PUBLICATIONS

Non-Final Office Action dated Dec. 22, 2022 for U.S. Appl. No. 16/884,319.

Notice of Allowance dated Jun. 7, 2023 or U.S. Appl. No. 16/884,319.

* cited by examiner

INTEGRATED CHIP INDUCTOR STRUCTURE

REFERENCE TO RELATED APPLICATION

This application is a Divisional of U.S. application Ser. No. 16/884,319, filed on May 27, 2020, the contents of which are hereby incorporated by reference in their entirety.

BACKGROUND

An integrated circuit (IC) is an assembly of electronic components on a piece of semiconductor material. A widely used electronic component in an IC is an inductor. An inductor is a passive element that stores electrical energy in a magnetic field when electric current flows through the inductor. Inductors are versatile devices that may be used in, among other things, resistor-inductor (RL) filters, inductor-capacitor (LC) circuits, resistor-inductor-capacitor (RLC) circuits, power supplies, transformers, and many other circuit components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
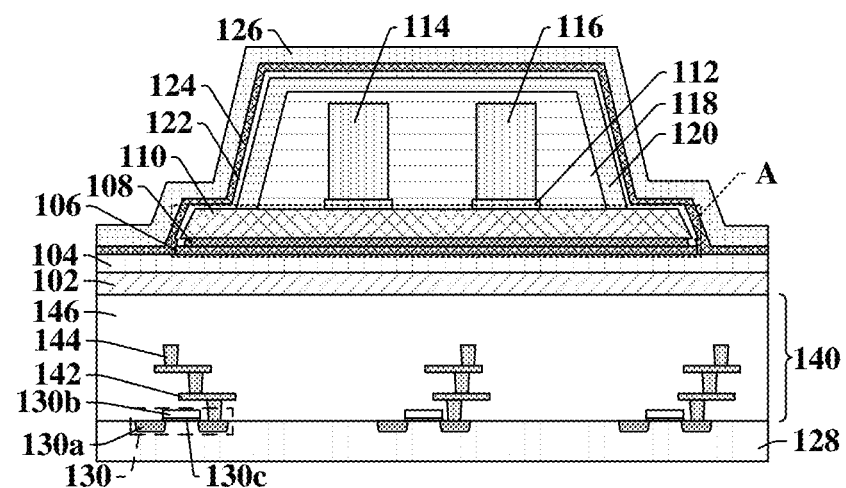
FIGS. 1A-1B illustrate cross-sectional views of some embodiments of an inductor structure having a first pattern enhancement layer between a first etch stop layer and a first magnetic shielding structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Inductors having useful inductances often consume a large area on an integrated circuit. Therefore, to avoid occupying valuable space, inductor structures may be formed over an interconnect structure over a semiconductor substrate. Such inductor structures, in some embodiments, comprise an etch stop layer overlying a passivation layer on the interconnect structure. A magnetic structure is disposed over the etch stop layer. A first conductive wire and a second conductive wire extend in parallel with one another along an upper surface of the magnetic structure. A dielectric structure may overlie the first and second conductive wires, as well as the magnetic structure, such that the first and second conductive wires are spaced apart from one another and covered by the dielectric structure.

During operation, the first and second conductive wires may each be coupled to control circuitry configured to apply a first current to the first conductive wire in a first direction and a second current to the second conductive wire in a second direction. Because of the "right-hand rule," first and second magnetic fields may be induced around the first and second conductive wires, respectively, and give the inductor structure a measureable inductance. In some embodiments, the magnetic structure is configured to concentrate the first and second magnetic fields near the first and second conductive wires and away from an underlying interconnect structure.

In some embodiments, the magnetic structure may be formed by depositing a tantalum layer over an etch stop layer, depositing a cobalt zinc tantalum (CZT) layer over the tantalum layer, and further depositing an oxygen-CZT (OCZT) layer over the CZT layer. A first wet etching process may be used to remove peripheral portions of these layers according to a masking layer. However, during the first wet etching process residue from the OCZT layer may be produced and stick to the etch stop layer because the OCZT layer has a slower etch rate than the CZT layer and the tantalum layers. In some embodiments, the OCZT residue may be detected as cobalt oxygen (CoO) precipitates through chemical analysis, such as energy dispersive X-ray spectroscopy (EDX) analysis. A dry etching process may be subsequently performed to remove peripheral portions of the etch stop layer, but at least some of the OCZT residue (e.g., CoO precipitates) and underlying etch stop layer remains because the OCZT residue may be resistant to the dry etching process. The OCZT residue may negatively impact the effectiveness of the magnetic structure and cause leakage of the first and second magnetic fields.

Various embodiments of the present disclosure present an inductor structure comprising a first pattern enhancement layer between a magnetic structure and the first etch stop layer. The magnetic structure may comprise several groups of layers, respectively comprising a tantalum layer, a CZT layer arranged over the tantalum layer, and an oxygen-CZT (OCZT) layer arranged over the CZT layer. The first pattern enhancement layer may be thicker than a lowermost layer of the magnetic structure, and provide more space and time for the OCZT residue to get removed during the patterning of the magnetic structure. For example, during the first wet etching process, OCZT residue (e.g., CoO precipitates) is produced as a topmost OCZT layer is exposed to the first wet etching process. By the time a bottommost OCZT layer is exposed to the first wet etching process, the OCZT residue from the topmost OCZT layer is almost completely or completely removed, but OCZT residue from the bottommost OCZT layer is produced. In order for the OCZT residue from the bottommost OCZT layer to be removed and to prevent the OCZT residue from contacting the first etch stop layer, the first pattern enhancement layer provides another barrier between the OCZT residue and the first etch stop layer. Thus, by the time the first pattern enhancement layer is removed from the first etch stop layer, the OCZT residue has been completely removed. Therefore, the first pattern enhancement layer and the first wet etching process may effectively remove OCZT residue before the OCZT residue contacts the first etch stop layer such that the inductor structure can reliably concentrate first and second magnetic fields induced by the first and second conductive wires, respectively.

FIG. 1A illustrates a cross-sectional view 100A of some embodiments of an inductor structure comprising a first pattern enhancement layer.

The inductor structure in the cross-sectional view 100A includes a first passivation layer 102 and a first barrier layer 104 arranged over an interconnect structure 140. In some embodiments, the interconnect structure 140 comprises a network of interconnect wires 142 and interconnect vias 144 embedded in an interconnect dielectric structure 146. In some embodiments, the interconnect structure 140 is arranged over a substrate 128 and coupled to semiconductor devices 130. In some embodiments, the semiconductor devices 130 may be, for example, metal oxide semiconductor field-effect transistors (MOSFETs) comprising source/drain regions 130$a$ within the substrate 128 and a gate electrode 130$b$ over the substrate 128. The gate electrode 130$b$ may be separated from the substrate 128 by a gate dielectric layer 130$c$. The semiconductor devices 130 and the interconnect structure 140 may be coupled to a first conductive wire 114 and/or a second conductive wire 116 to operate the inductor structure.

The first and second conductive wires 114, 116 are arranged over a first magnetic structure 110, and the first magnetic structure 110 may be arranged over a first etch stop layer 106. In some embodiments, a first pattern enhancement layer 108 may be arranged between the first etch stop layer 106 and the first magnetic structure 110. The first pattern enhancement layer 108, in some embodiments, may directly underlie the first magnetic structure 110 and may be narrower than a bottommost surface of the first magnetic structure 110. Thus, the first pattern enhancement layer 108 may have been laterally etched more or faster than the first magnetic structure 110. The first pattern enhancement layer 108 may comprise a material that can be dissolved in a same wet etchant as the first magnetic structure 110. For example, in some embodiments, the wet etchant may comprise a mixture of nitric acid and hydrofluoric acid, and the first pattern enhancement layer 108 may comprise tantalum, silicon nitride, titanium, tungsten, zirconium, nickel, silicon germanium, tin, niobium, vanadium, or indium antimony.

In some embodiments, a second barrier layer 112 isolates the first and second conductive wires 114, 116 from the first magnetic structure 110. Further, a dielectric structure 118 may overlie the first and second conductive wires 114, 116, as well as the first magnetic structure 110, such that the first and second conductive wires 114, 116 are spaced apart from one another and covered by the dielectric structure 118. In some embodiments, the dielectric structure 118 may have a substantially planar top surface. A first isolation layer 120 overlies the dielectric structure 118 and the first magnetic structure 110. A third barrier layer 122 may overlie the first isolation layer 120 and laterally surround the first magnetic structure 110 and the first pattern enhancement layer 108. A second etch stop layer 124 may overlie the third barrier layer 122, and a second magnetic structure 126 may overlie the second etch stop layer 124.

During operation of the inductor structure, a first current may be applied to the first conductive wire 114, and a second current may be applied to the second conductive wire 116 by the semiconductor devices 130, for example. First and second magnetic fields may be induced around the first and second conductive wires 114, 116, respectively. The first and second magnetic structures 110, 126 may shield the first and second magnetic fields to concentrate a magnetic flux of the inductor structure near the first and second conductive wires 114, 116.

The first pattern enhancement layer 108 is configured to delay exposure of the first etch stop layer 106 during an etching process used to pattern the first magnetic structure 110. By delaying exposure of the first etch stop layer 106, the etching process has time to remove residue from the first magnetic structure 110 before exposing the first etch stop layer 106, thereby preventing a buildup of residue from the first magnetic structure 110 onto the first etch stop layer 106. By preventing a buildup of residue from the first magnetic structure 110 onto the first etch stop layer 106, the reliability of the first magnetic structure 110 in concentrating the magnetic flux to near the first and second conductive wires 114, 116 is increased during operation.

Figure 1B:
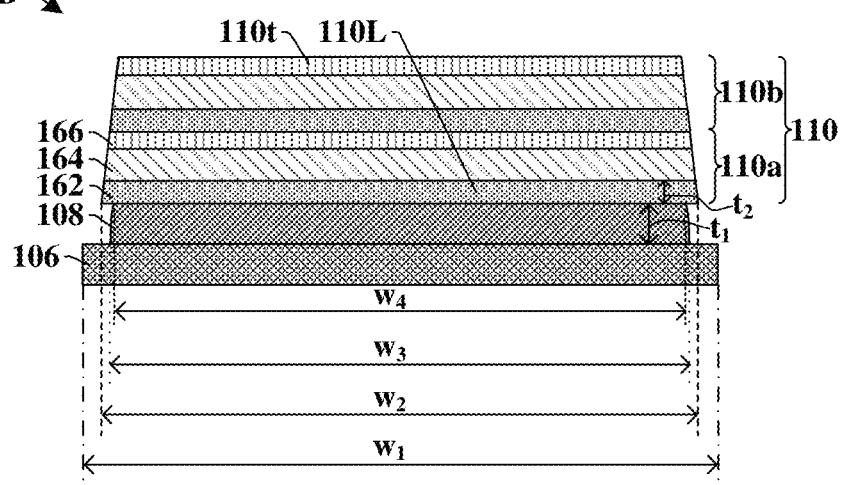

FIG. 1B illustrates a cross-sectional view 100B that may correspond to some embodiments of the first magnetic structure 110 and the first pattern enhancement layer 108 in box A of the cross-sectional view 100A of FIG. 1A.

In some embodiments, the first magnetic structure 110 may comprise a first group of layers 110$a$ and a second group of layers 110$b$. In some embodiments, the first group of layers 110$a$ and/or second group of layers 110$b$ comprise a tantalum layer 162, a cobalt zinc tantalum (CZT) layer 164 arranged over the tantalum layer 162, and an oxygen-CZT (OCZT) layer 166 arranged over the CZT layer 164. In some embodiments, the first magnetic structure 110 may have an overall trapezoidal-like shape. In some embodiments, a lowermost layer 110L (e.g., a bottommost one of the tantalum layer 162) of the first magnetic structure 110 is wider than a topmost layer 110t (e.g., a topmost one of the OCZT layer 166) of the first magnetic structure 110.

The first pattern enhancement layer 108 may be arranged between the tantalum layer 162 and the first etch stop layer 106. The tantalum layer 162 that directly contacts the first pattern enhancement layer 108 does not extend below a top surface of the first pattern enhancement layer 108. In some embodiments, the first pattern enhancement layer 108 has a first thickness $t_1$ that is in a range of between, approximately 300 angstroms and approximately 1000 angstroms. In some embodiments, the tantalum layer 162 that directly contacts the first pattern enhancement layer 108 may have a second thickness $t_2$ that is in a range of between, for example, approximately 15 angstroms and approximately 50 angstroms. Thus, the first thickness $t_1$ may be greater than the second thickness $t_2$. The first pattern enhancement layer 108 may be thicker than the tantalum layer 162 in order to provide more time for OCZT residue to be removed during a first wet etching process before the first etch stop layer 106 is exposed (see, FIGS. 11A-G).

In some embodiments, the first pattern enhancement layer 108 may have outermost sidewalls that are curved from the cross-sectional view 100B.

Further, the first etch stop layer 106 has a first width $w_1$; the lowermost layer 110L of the first magnetic structure 110 has a bottom surface that has a second width $w_2$; the first pattern enhancement layer 108 has a bottom surface that has a third width $w_3$; and the first pattern enhancement layer 108 has a top surface that has a fourth width $w_4$. In some embodiments, the first width $w_1$ is greater than the second, third, and fourth widths $w_2$, $w_3$, $w_4$. Further, in some embodiments, the second width $w_2$ is greater than the third width $w_3$. In some embodiments, the second width $w_2$ is also greater than the fourth width $w_4$. The second width $w_2$ is greater than the third width $w_3$ and/or fourth width $w_4$ because in some embodiments, the first pattern enhancement layer 108 has a higher etch rate than the tantalum layer 162, such that the first pattern enhancement layer 108 does not significantly increase the time of a first wet etching process and reduce manufacturing efficiency.

Figure 2:
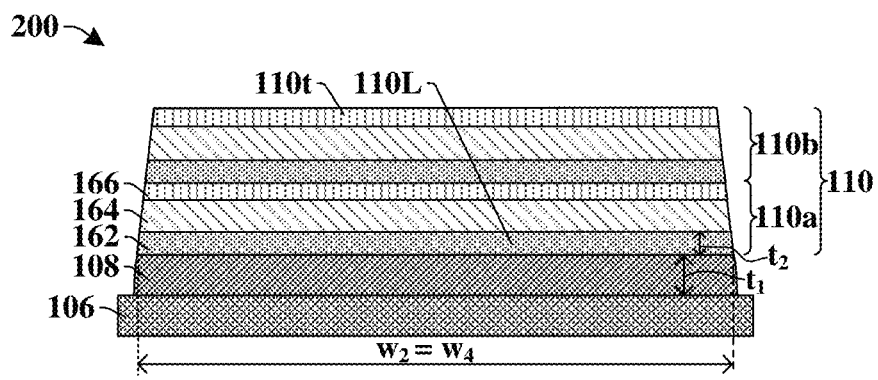
FIGS. 2-4 illustrate cross-sectional views of some additional embodiments of a first pattern enhancement layer between a first etch stop layer and a first magnetic shielding structure.

FIG. 2 illustrates a cross-sectional view 200 of an alternative embodiment of FIG. 1B, wherein the second width $w_2$ of the bottom surface of the lowermost layer 110L of the first magnetic structure 110 is about equal to the fourth width $w_4$ of the top surface of the first pattern enhancement layer 108. In such embodiments, the first pattern enhancement layer 108 and the lowermost layer 110L of the first magnetic structure 110 may have about equal etch rates. In such embodiments, because the first pattern enhancement layer 108 does not have a higher etch rate than the lowermost layer 110L (a bottom one of the tantalum layers 162) of the first magnetic structure 110, there is more time during the first wet etching process to remove OCZT residue before the first etch stop layer 106 is exposed upon the first pattern enhancement layer's 108 removal.

Figure 3:
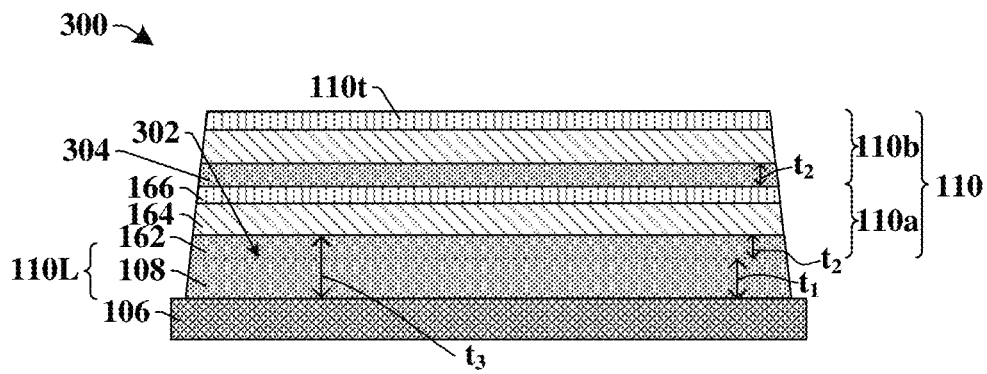

FIG. 3 illustrates a cross-sectional view 300 of another alternative embodiment of FIG. 1B, wherein the first pattern enhancement layer 108 and the tantalum layer 162 both comprise tantalum.

In such embodiments, the lowermost layer 110L of the first magnetic structure 110 may appear to comprise the tantalum layer 162 and the first pattern enhancement layer 108 because a first interface 302 between the tantalum layer 162 and the first pattern enhancement layer 108 may not be visible, as illustrated by a dotted line. In such embodiments, the presence of the first pattern enhancement layer 108 may be identified by the lowermost layer 110L of the first magnetic structure 110 having a third thickness $t_3$, which may be a maximum thickness of the lowermost layer 110L. The third thickness $t_3$ may be greater than the second thickness $t_2$ of an upper tantalum layer 304. The upper tantalum layer 304 is above the lowermost layer 110L of the first magnetic structure 110.

Further, in some embodiments, the first magnetic structure 110 and/or the first pattern enhancement layer 108 may have outermost sidewalls that are substantially planar.

Figure 4:
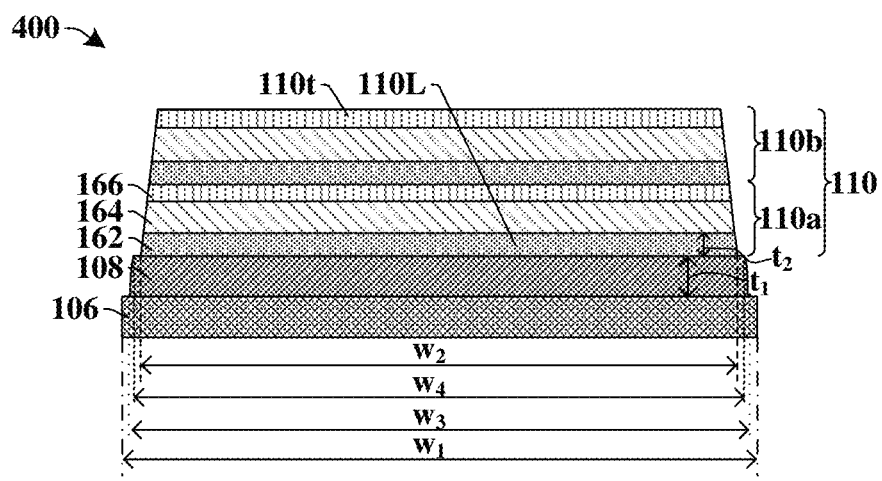

FIG. 4 illustrates a cross-sectional view 400 of yet another alternative embodiment of FIG. 1B, wherein the first pattern enhancement layer 108 is wider than the first magnetic structure 110.

In some embodiments, the first pattern enhancement layer 108 may have a slower etch rate than the lowermost layer 110L of the first magnetic structure 110 to increase the time to remove OCZT residue (e.g., CoO precipitates) during the first wet etching process before the first etch stop layer 106 is exposed. In such embodiments, third and fourth widths $w_3$, $w_4$ of the first pattern enhancement layer 108 may be larger than the second width $w_2$ of the lowermost layer 110L of the first magnetic structure 110.

Figure 5:
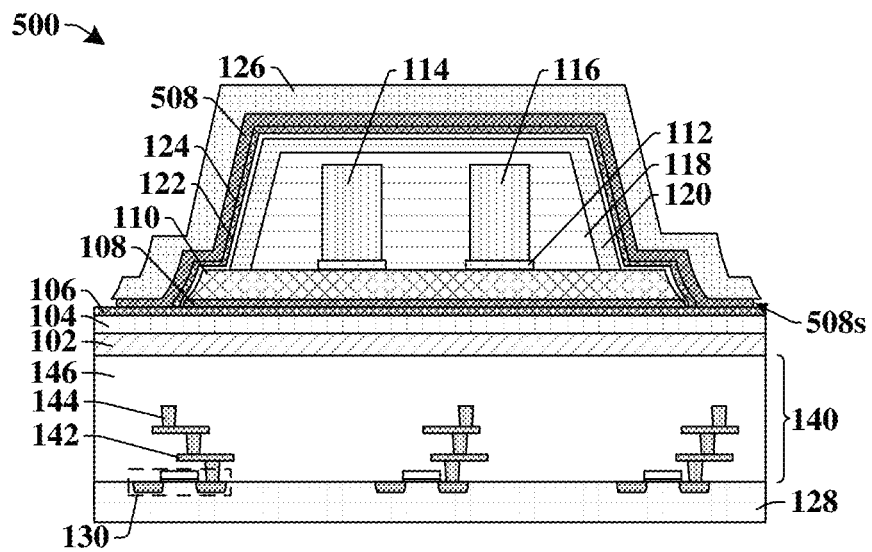
FIG. 5 illustrates a cross-sectional view of some additional embodiments of an inductor structure having a first pattern enhancement layer between a first etch stop layer and a first magnetic shielding structure and having a second pattern enhancement layer between a second etch stop layer and a second magnetic shielding structure.

FIG. 5 illustrates a cross-sectional view 500 of some embodiments of an inductor structure having a first pattern enhancement layer and a second pattern enhancement layer.

In some embodiments, an inductor structure also has a second pattern enhancement layer 508 arranged between the second magnetic structure 126 and the second etch stop layer 124. In some embodiments, the second pattern enhancement layer 508 may have outermost sidewalls 508s that directly underlie the second magnetic structure 126. In other embodiments (not shown), the second pattern enhancement layer 508 may have outermost sidewalls 508s that do not directly underlie the second magnetic structure 126. The second pattern enhancement layer 508 may prevent residue from the second magnetic structure 126 from contacting and sticking to the second etch stop layer 124 during a third wet etching process to pattern the second magnetic structure 126.

In some embodiments, the second magnetic structure 126 may comprise a different structure than the first magnetic structure 110. For example, in some embodiments, the second magnetic structure 126 may comprise, for example, three groups of layers (110a, 110b, 110c of FIG. 20), whereas the first magnetic structure 110 may comprise, for example, two groups of layers (110a, 110b of FIG. 1B). In other embodiments, the first and second magnetic structures 110, 126 may comprise different materials than one another. Thus, in some embodiments, the first pattern enhancement layer 108 and the second pattern enhancement layer 508 may comprise different materials and/or have different thicknesses. In other embodiments, it will be appreciated that the first pattern enhancement layer 108 and the second pattern enhancement layer 508 may comprise a same material and/or have about the same thickness.

Figure 6:
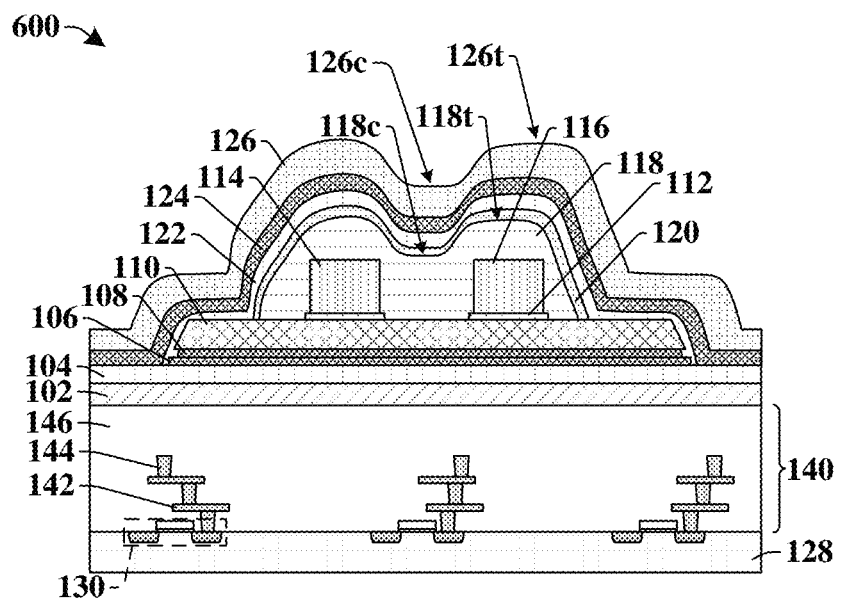
FIG. 6 illustrates a cross-sectional view of some additional embodiments of an inductor structure having a first pattern enhancement layer below a first magnetic shielding structure, and a second magnetic shielding structure having a center portion recessed below topmost portions of the second magnetic shielding structure.

FIG. 6 illustrates a cross-sectional view 600 of some alternative embodiments of the inductor structure as shown in the cross-sectional view 100A of FIG. 1A.

In some embodiments, the dielectric structure 118 may have an upper surface. A center portion 118c of the upper surface is recessed below topmost portions 118t of the upper surface of the dielectric structure 118. The topmost portions 118t of the upper surface of the dielectric structure 118 may overlie the first and second conductive wires 114, 116, and the center portion 118c of the upper surface of the dielectric structure 118 may overlie the space between the first and second conductive wires 114, 116. As a result, the first isolation layer 120, the third barrier layer 122, the second etch stop layer 124, and the second magnetic structure 126 may also have upper surfaces with a center portion recessed below topmost portions. For example, in some embodiments, the second magnetic structure 126 may have an upper surface that has a center portion 126c recessed below topmost portions 126t of the upper surface of the second magnetic structure 126. Thus, in some embodiments, the center portion 126c of the upper surface of the second magnetic structure 126 may directly overlie the center portion 118c of the upper surface of the dielectric structure 118. Similarly, in some embodiments, the topmost portions 126t of the upper surface of the second magnetic structure 126 may directly overlie the topmost portions 118t of the upper surface of the dielectric structure 118.

Figure 7:
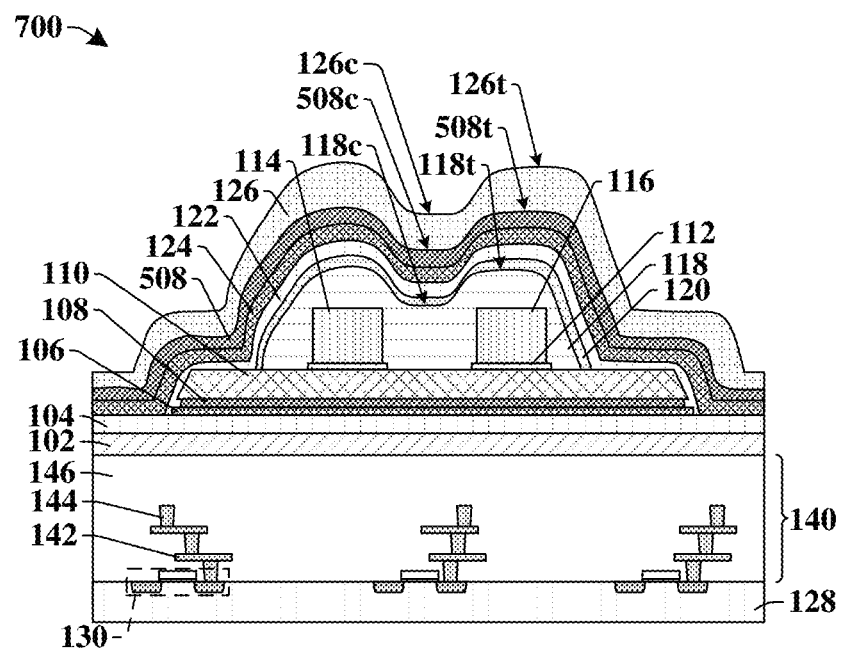
FIG. 7 illustrates a cross-sectional view of some additional embodiments of an inductor structure having a second pattern enhancement layer between a second magnetic shielding structure and a second etch stop layer, wherein the second pattern enhancement layer has a center portion recessed below topmost portions of the second pattern enhancement layer.

FIG. 7 illustrates a cross-sectional view 700 of some alternative embodiments of the inductor structure as shown in the cross-sectional view 500 of FIG. 5.

As shown in cross-sectional view 700, the dielectric structure 118 may have an upper surface with a center portion 118c that is recessed below topmost portions 118t of the upper surface of the dielectric structure 118. In some embodiments, a second pattern enhancement layer 508 may be arranged between the second magnetic structure 126 and the second etch stop layer 124. Thus, in some embodiments, the second pattern enhancement layer 508 may have an upper surface, wherein a center portion 508c of the upper surface of the second pattern enhancement layer 508 is recessed below topmost portions 508t of the upper surface of the second pattern enhancement layer 508. In such embodiments, the center portion 508c of the upper surface of the second pattern enhancement layer 508 may directly overlie the center portion 118c of the upper surface of the dielectric structure 118, and the topmost portions 508t of the upper surface of the second pattern enhancement layer 508 may directly overlie the topmost portions 118t of the upper surface of the dielectric structure 118.

Figure 8A:
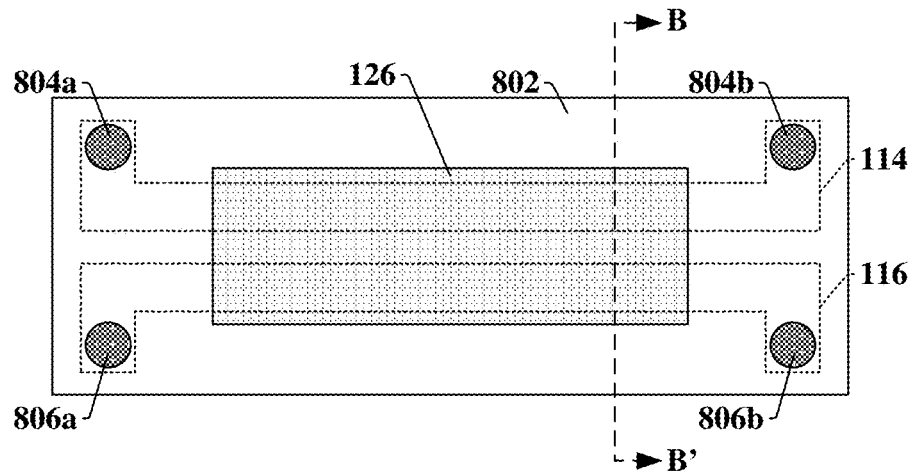
FIGS. 8A and 8B illustrate various views of some embodiments of an inductor structure having a first pattern enhancement layer and coupled to an interconnect structure by contact vias.

FIG. 8A illustrates a top-view 800A of some embodiments of an inductor structure, wherein the first and second conductive wires are coupled to contact vias.

In some embodiments, from the top-view 800A, the first and second conductive wires 114, 116 are not visible, and thus, are represented with dotted lines in FIG. 8A. In some embodiments, the first and second conductive wires 114, 116 are partially covered by the second magnetic structure 126. Under the second magnetic structure 126, the first and second conductive wires 114, 116 may extend parallel to one another. Further, an interconnect passivation layer 802 may overlie the interconnect structure (140 of FIG. 1A), in some embodiments. Portions of the first and second conductive wires 114, 116 may be embedded under the interconnect passivation layer 802, in some embodiments. The first conductive wire 114 may be coupled to a first contact via 804a and a second contact via 804b, in some embodiments. The second conductive wire 116 may be coupled to a third contact via 806a and a fourth contact via 806b. Thus, during operation, a first current may be applied across the first and second contact vias 804a, 804b to induce a first magnetic field in the first conductive wire 114, and a second current may be applied across the third and fourth contact vias 806a, 806b to induce a second magnetic field in the second conductive wire 116. The second magnetic structure 126 and the first magnetic structure (110 of FIG. 1A) may effectively concentrate the magnetic flux near the first and second conductive wires 114, 116.

Figure 8B:
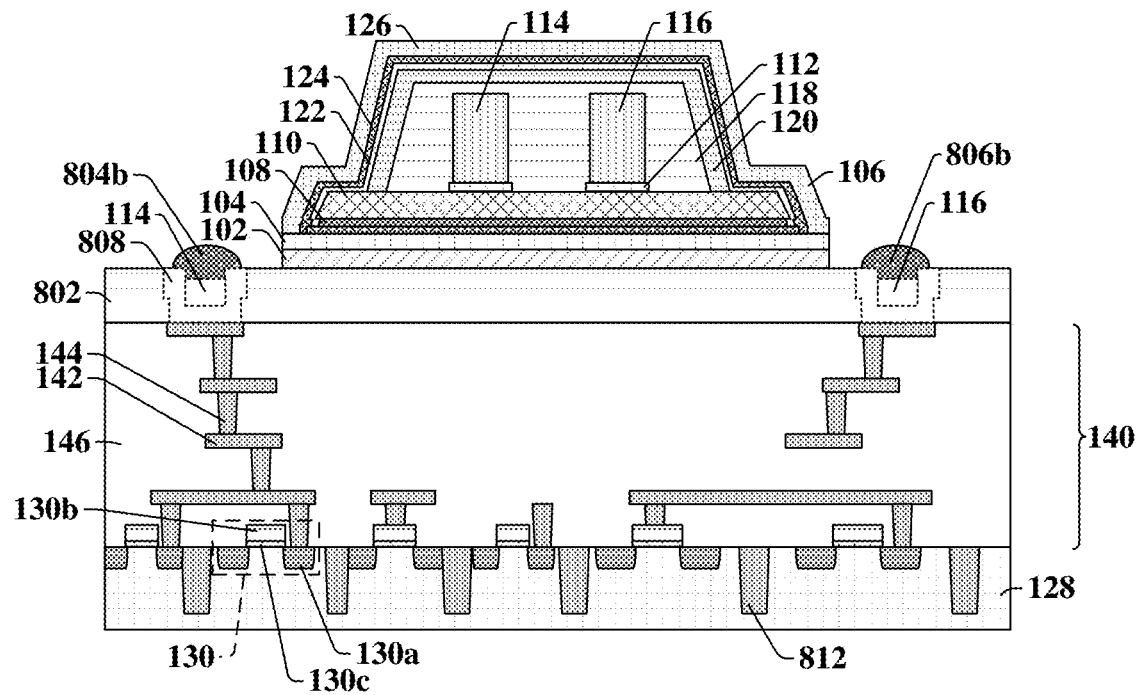

FIG. 8B illustrates a cross-sectional view 800B of some embodiments of the inductor structure along line BB' of FIG. 8A.

In some embodiments, the portions of the first and second conductive wires 114, 116 that are embedded in the interconnect passivation layer 802 are not visible in the cross-sectional view 800B, as illustrated by the dotted lines. In some embodiments, the interconnect passivation layer 802 may comprise, for example, silicon dioxide, silicon nitride, polyimide compounds, or other suitable materials. Further, in some embodiments, contact layers 808 are below the second contact via 804b and the fourth contact via 806b. Thus, in some embodiments, a portion of the first conductive wire 114 is embedded in the interconnect passivation layer 802 and in electrical contact with one of the contact layers 808 and the second contact via 804b, and a portion of the second conductive wire 116 is embedded in the interconnect passivation layer 802 and in electrical contact with one of the contact layers 808 and the fourth contact via 806b. In other embodiments, the second contact via 804b and the fourth contact via 806b may be omitted. In some embodiments, the contact layers 808 may comprise, for example aluminum, copper, or the like. The contact layers 808 may be coupled to the semiconductor devices 130 by the interconnect structure 140.

In some embodiments, isolation structures 812 may be embedded in the substrate 128 and between each of the semiconductor devices 130 for electrical isolation between each semiconductor device 130. In some embodiments, the semiconductor devices 130 used to control the current in the first and second conductive wires 114, 116 may be or comprise one or more of the following: a low voltage (e.g., 1.8V-3.3V) device and a high voltage device.

FIGS. 9, 10, 11A-G, and 12-20 illustrate cross-sectional views 900, 1000, 1100A-G, and 1200-2000 of some embodiments of a method of forming an inductor structure having a first pattern enhancement layer arranged between a first magnetic structure and a first etch stop layer. Although FIGS. 9, 10, 11A-G, and 12-20 are described in relation to a method, it will be appreciated that the structures disclosed in FIGS. 9, 10, 11A-G, and 12-20 are not limited to such a method, but instead may stand alone as structures independent of the method.

Figure 9:
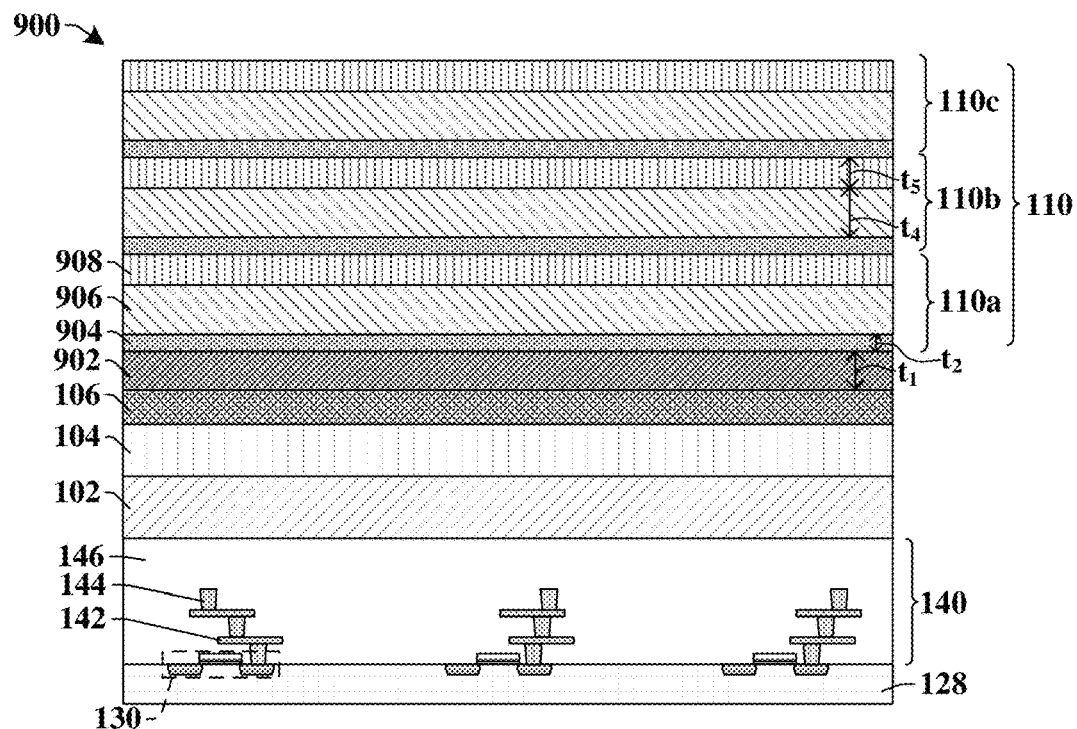
FIGS. 9-20 illustrate cross-sectional views of some embodiments of a method of forming an inductor structure having a first pattern enhancement layer between a first etch stop layer and a first magnetic shielding structure.

As shown in cross-sectional view 900 of FIG. 9, in some embodiments, an interconnect structure 140 may be formed over a substrate 128. The interconnect structure 140 may comprise interconnect wires 142 and interconnect vias 144 embedded in an interconnect dielectric structure 146. In some embodiments, the interconnect wires and vias 142, 144 may comprise copper, tungsten, aluminum, or the like. The interconnect structure 140 may be coupled to semiconductor devices 130 integrated on the substrate 128. In some embodiments, the semiconductor devices 130 may be or comprise metal oxide semiconductor field-effect transistors (MOSFETs). The MOSFETs comprise source/drain regions 130a in the substrate 128. The semiconductor devices 130 may further comprise a gate electrode 130b arranged over a gate dielectric layer 130c on the substrate 128.

In some embodiments, a first passivation layer 102 is formed over the interconnect structure 140, and the first passivation layer 102 may comprise, for example, a nitride (e.g., silicon nitride), an oxide (e.g., silicon dioxide), or the like. A first barrier layer 104 may be formed over the first passivation layer 102, and the first barrier layer 104 may comprise, for example, silicon nitride, silicon carbide, or the like. Thus, in some embodiments, the first barrier layer 104 may comprise a same material as the first passivation layer 102. In other embodiments, the first barrier layer 104 may comprise a different material than the first passivation layer 102. In some embodiments, the first passivation layer 102 and the first barrier layer 104 may be deposited using a deposition process (e.g., chemical vapor deposition (CVD), physical vapor deposition (PVD), atomic layer deposition (ALD), etc.).

A first etch stop layer 106 is deposited over the first barrier layer 104, and the first etch stop layer 106 may comprise, for example, a metal oxide, such as tantalum oxide, titanium oxide, another suitable etch stop material, or the like. In some embodiments, a method for forming the first etch stop layer 106 may include: forming a metal material (e.g., tantalum) over the first barrier layer 104; and subsequently performing a thermal annealing process (e.g., with water ($H_2O$)) to convert the metal material to a metal oxide.

A first pattern enhancement material 902 may be formed over the first etch stop layer 106. The first pattern enhancement material 902 may form a layer having a first thickness $t_1$ in a range of between, for example, approximately 300 angstroms and approximately 1000 angstroms. A first magnetic structure 110 comprising a first group of layers 110a, a second group of layers 110b, and a third group of layers 110b may be deposited over the first pattern enhancement material 902. The first group of layers 110a may comprise a tantalum material 904 deposited over the first pattern enhancement material 902, a cobalt zinc tantalum (CZT) material 906 deposited over the tantalum material 904, and an oxygen-CZT (OCZT) material 908 deposited over the CZT material 906. In some embodiments, the tantalum material 904 comprises tantalum, the CZT material 906 comprises CZT, and the OCZT material 908 comprises OCZT.

In some embodiments, the tantalum material 904 may form a layer having a second thickness $t_2$ that is less than the first thickness $t_1$. For example, in some embodiments, the second thickness $t_2$ is in a range of between approximately 15 angstroms and approximately 50 angstroms. In some embodiments, the CZT material 906 may form a layer having a fourth thickness $t_4$ that is in a range of between approximately 4000 angstroms and approximately 5000 angstroms. In some embodiments, the OCZT material 908 may form a layer having a fifth thickness $t_5$ that is in a range of between approximately 150 angstroms and approximately 500 angstroms. In other embodiments, the fifth thickness $t_5$ may be greater than 500 angstroms. Thus, the fourth thickness $t_4$ may be greater than the first, second, and fifth thickness $t_1$, $t_2$, $t_5$.

The amount of oxygen in the OCZT material 908 and/or the fifth thickness $t_5$ of the OCZT material 908 may influence the resistance of the first magnetic structure 110. In some embodiments, the first thickness $t_1$ depends on the fifth thickness $t_5$. For example, if the fifth thickness $t_5$ of the OCZT material 908 is increased, the first thickness $t_1$ of the first pattern enhancement material 902 is also increased.

In some embodiments, the first pattern enhancement material 902 comprises a material that can be dissolved by a same wet etchant that is used to remove portions of the tantalum material 904, the CZT material 906, and the OCZT material 908. For example, in some embodiments the wet etchant used to pattern the first magnetic structure 110 is or comprises a mixture of nitric acid and hydrofluoric acid. In such embodiments, the first pattern enhancement material 902 may comprise, for example, tantalum, silicon nitride, titanium, tungsten, zirconium, nickel, silicon germanium, tin, niobium, vanadium, or indium antimony. Further, in some embodiments, the first pattern enhancement material 902 may comprise a material that has an oxygen concentration that does not exceed 10 percent. If the oxygen concentration of the first pattern enhancement material 902 were to exceed 10 percent, in some embodiments, the oxygen in the first pattern enhancement material 902 would react with other elements when exposed to the wet etchant, and form oxide precipitates.

Additionally, in some embodiments, the first pattern enhancement material 902 comprises a material that has a higher etch rate than the OCZT material 908. In other embodiments, the first pattern enhancement material 902 may have a faster or slower etch rate than one or more of the materials in the first magnetic structure 110. In some embodiments, the first pattern enhancement material 902, the tantalum material 904, the CZT material 906, and the OCZT material 908 may each be formed using a deposition process (e.g., physical vapor deposition (PVD), chemical vapor deposition (CVD), PE-CVD, atomic layer deposition (ALD), sputtering, etc.). Multiple cycles of deposition processes may be repeated for the tantalum material 904, the CZT material 906, and the OCZT material 908, depending on the number of groups of layers (e.g., 110a, 110b, 110c, etc.) in the first magnetic structure 110.

Figure 10:
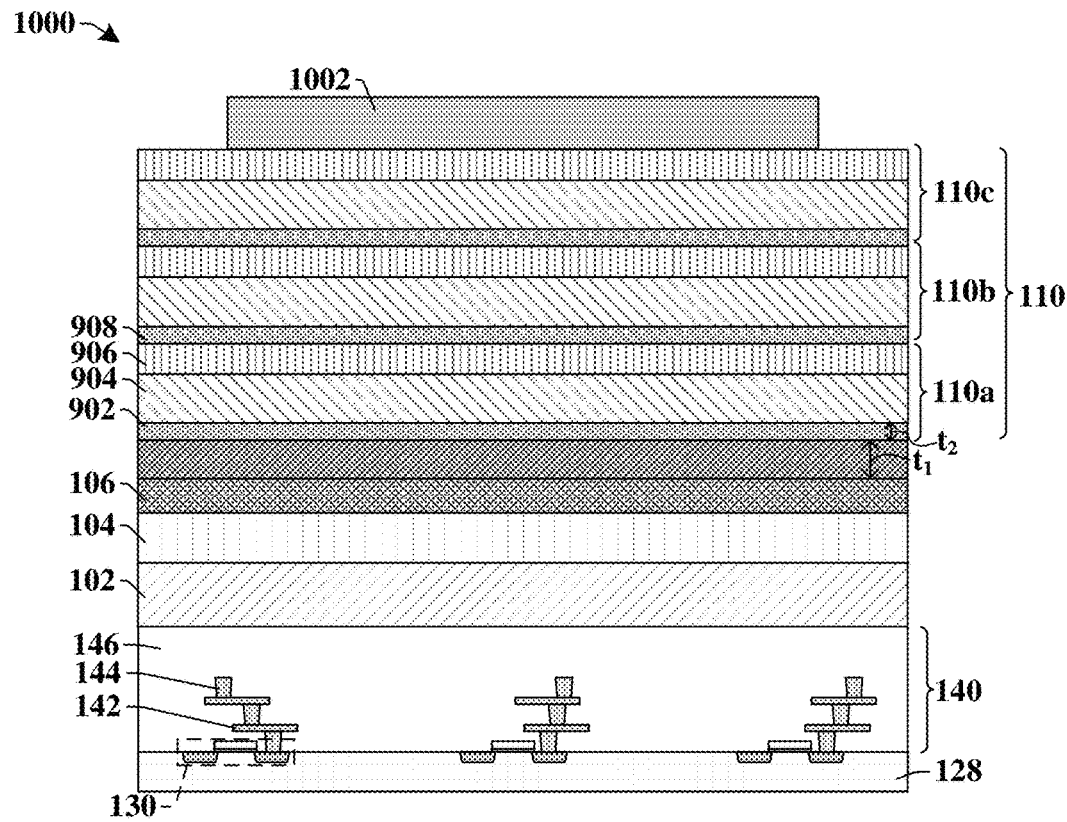

As shown in cross-sectional view 1000 of FIG. 10, a first masking layer 1002 is formed over the first magnetic structure 110. In some embodiments, the first masking layer 1002 may comprise a photoresist material and be formed using photolithography and removal (e.g., etching) processes. The first masking layer 1002 may be arranged such that outer portions of the first magnetic structure 110 do not directly underlie the first masking layer 1002.

Figure 11A:
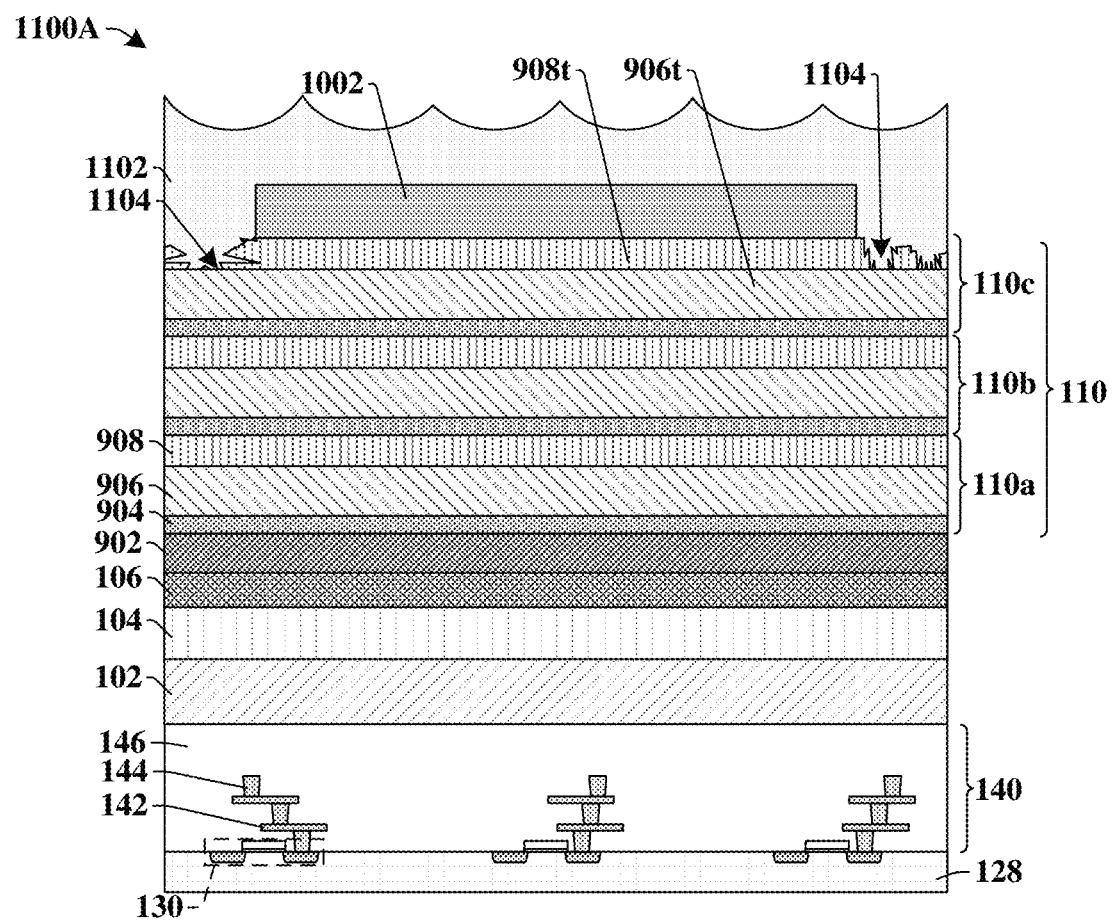

As shown in cross-sectional view 1100A of FIG. 11A, a first wet etching process is performed to remove outer portions of the first magnetic structure 110 and of the first pattern enhancement material 902. The cross-sectional views 1100A, 1100B, 1100C, 1100D, 1100E, 1100F, and 1100G illustrate the first wet etching process respectively at first, second, third, fourth, fifth, sixth, and seventh times, where the second time is after the first time, the third time is after the second time, and so on.

The first wet etching process is illustrated by showing the cross-sectional view 1100A submerged in a wet etchant 1102. In some embodiments, the wet etchant 1102 used is a mixture of nitric acid and hydrofluoric acid, for example. During the first time, a topmost OCZT layer 908t is exposed to the wet etchant 1102, and first areas 1104 of a topmost CZT layer 906t are exposed.

Figure 11B:
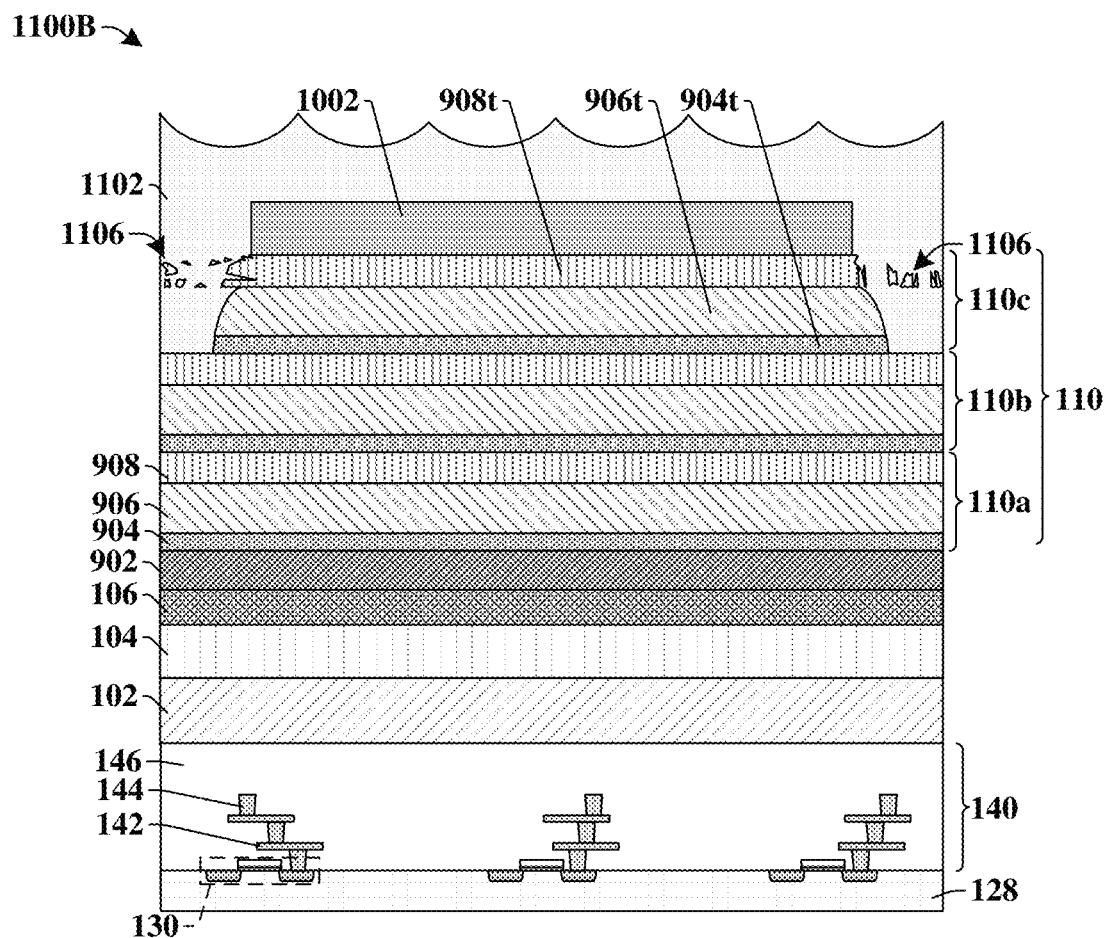

As shown in the cross-sectional view 1100B of FIG. 11B, as the first areas (1104 of FIG. 11A) of the topmost CZT layer 906t are exposed, the wet etchant 1102 quickly removes portions of the topmost CZT layer 906t and a topmost tantalum layer 904t because the CZT material 906 and the tantalum material 904 have higher etching rates than the OCZT material 908 when exposed to the wet etchant 1102. The topmost CZT layer 906t and the topmost tantalum layer 904t are removed so much faster than the topmost OCZT layer 908t, that OCZT residue 1106 is "free-floating" in the wet etchant 1102; in other words, the OCZT residue 1106 is discontinuous with the topmost OCZT layer 908t, and the OCZT residue 1106 is completely surrounded by the wet etchant 1102. Thus, the OCZT residue 1106 may be suspended or begin to "sink" (e.g., travel in a direction towards the first pattern enhancement material 902, for example). The OCZT residue 1106 may exhibit random shapes in some embodiments, or in other words, are not common geometrical shapes such as, for example, a circle, a triangle, a rectangle, etc. In some embodiments, the OCZT residue 1106 may be detected as CoO precipitates, for example, during chemical analysis, such as, EDX analysis. In other embodiments, chemical analysis such as EDX analysis, for example, may detect oxygen, cobalt, zinc, and tantalum when analyzing OCZT residue 1106.

Figure 11C:
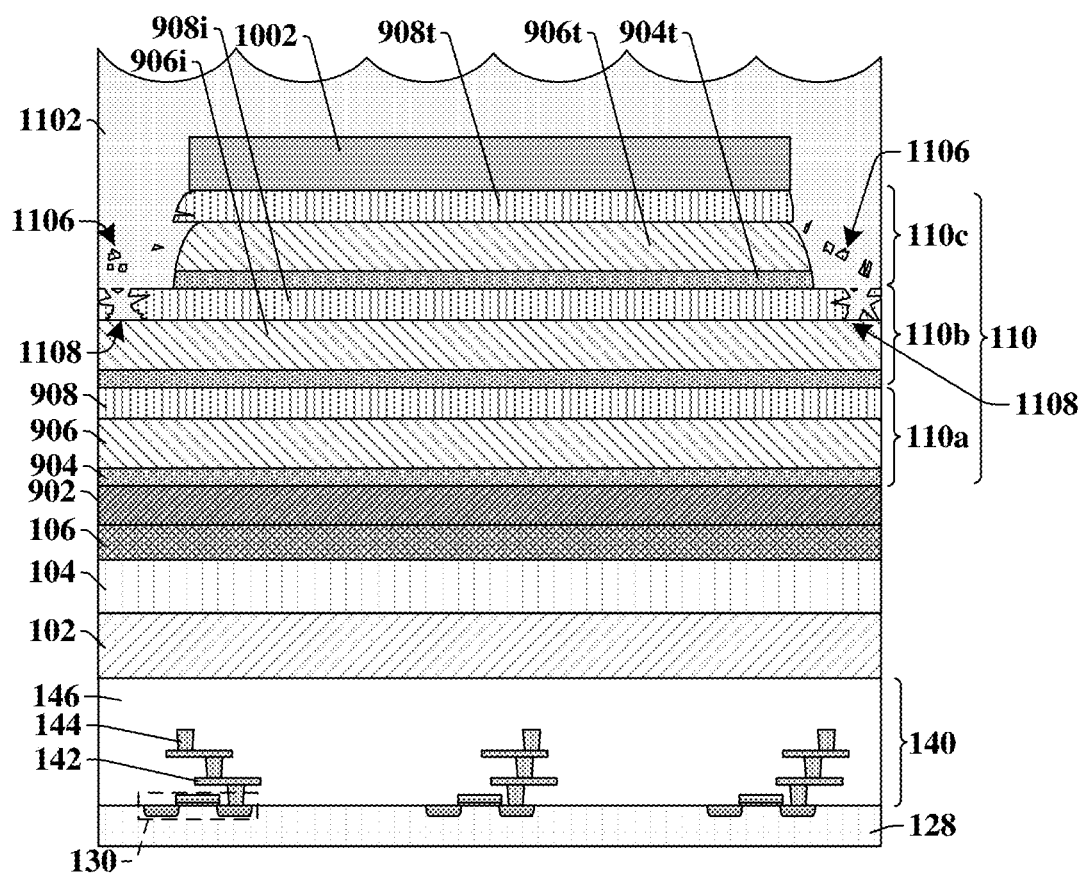

As shown in the cross-sectional view 1100C of FIG. 11C, the OCZT residue 1106 begins to sink towards an intermediate OCZT layer 908i as the intermediate OCZT layer 908i is exposed to the wet etchant 1102. The intermediate OCZT layer 908i is etched away and second areas 1108 of an intermediate CZT layer 906i are exposed to the wet etchant 1102.

Further, the OCZT residue 1106 is partially or completely removed by the wet etchant 1102 as the intermediate OCZT layer 908i is exposed to the wet etchant 1102. As the OCZT residue 1106 from the topmost OCZT layer 908t is removed, OCZT residue 1106 from the intermediate OCZT layer 908i begins to form. It will be appreciated that the topmost OCZT layer 908t, the topmost CZT layer 906t, and the topmost tantalum layer 904t continue to be etched (e.g., removed) by the wet etchant 1102, and thus, the topmost OCZT layer 908t, the topmost CZT layer 906t, and the topmost tantalum layer 904t are narrower in the cross-sectional view 1100C of FIG. 11C than in the cross-sectional view 1100B of FIG. 11B.

Figure 11D:
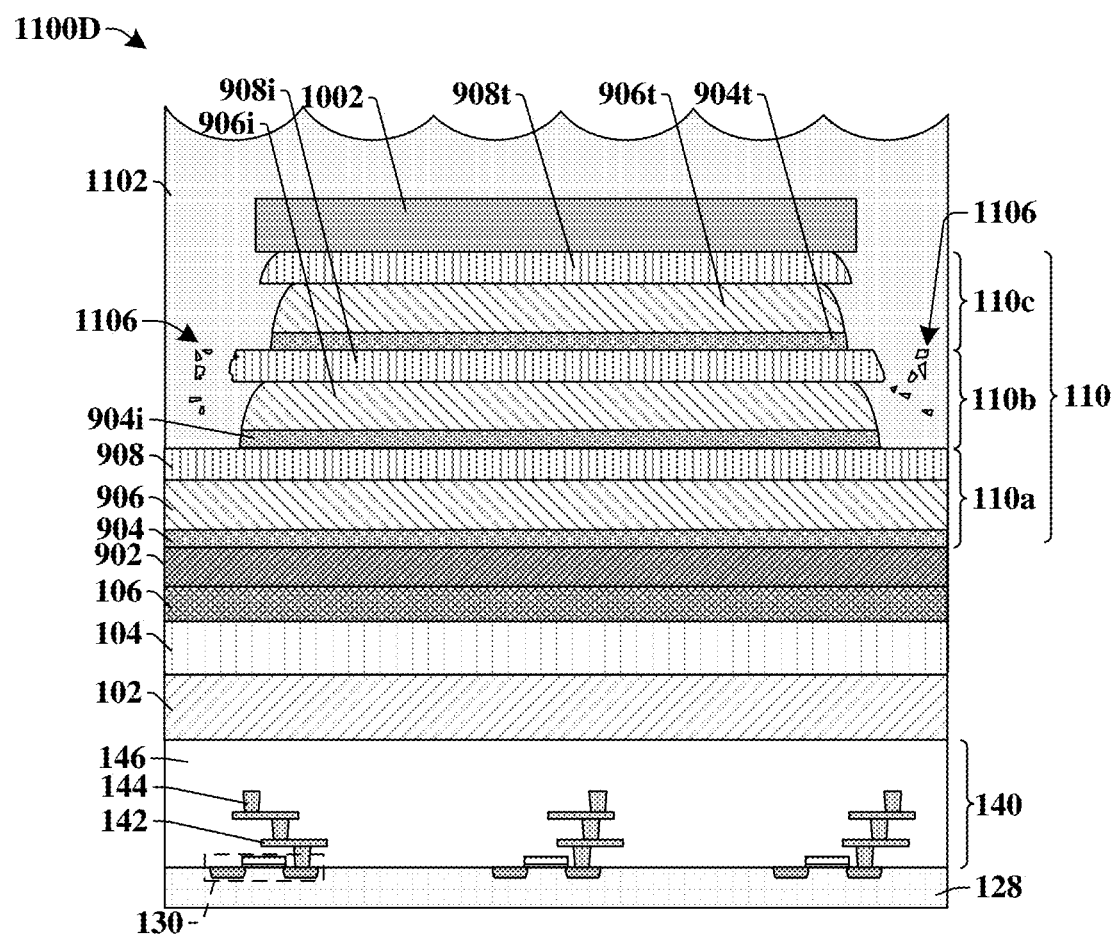

As shown in the cross-sectional view 1100D of FIG. 11D, as the second areas (1108 of FIG. 11C) of the intermediate CZT layer 906i are exposed, the wet etchant 1102 quickly removes portions of the intermediate CZT layer 906i and an intermediate tantalum layer 904i because the CZT material 906 and the tantalum material 904 have higher etching rates than the OCZT material 908 when exposed to the wet etchant 1102. More OCZT residue 1106 from the intermediate OCZT layer 908i may be left "free-floating" in the wet etchant 1102 and other previously formed OCZT residue 1106 from the topmost OCZT layer 908t may be partially or completely removed.

Figure 11E:
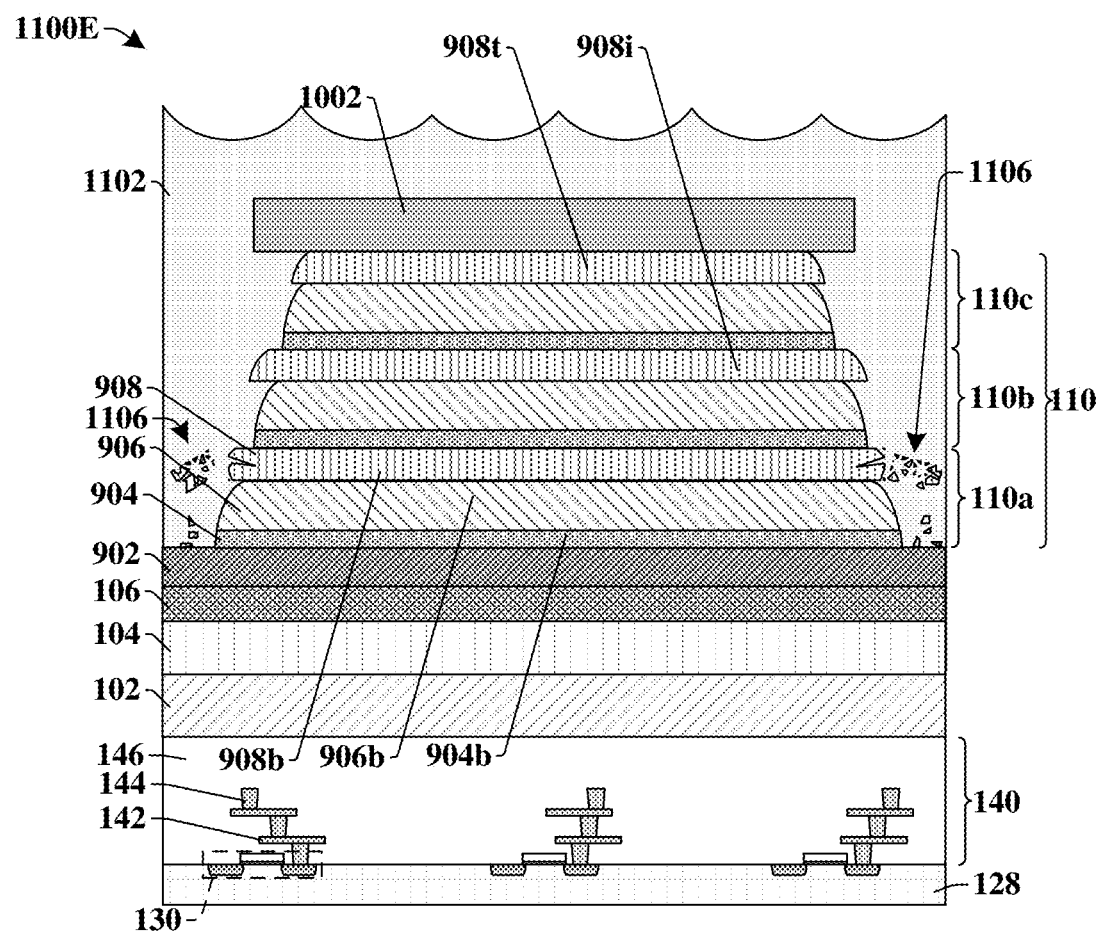

As shown in the cross-sectional view 1100E of FIG. 11E, a bottommost OCZT layer 908b, a bottommost CZT layer 906b, and a bottommost tantalum layer 904b are exposed to the wet etchant 1102, and more OCZT residue 1106 may be produced from the bottommost CZT layer 906b. Some of the OCZT residue 1106 may sink and contact the first pattern enhancement material 902, as the first pattern enhancement material 902 is exposed to the wet etchant 1102. The OCZT residue 1106 from the topmost OCZT layer 908t and the intermediate OCZT layer 908i may be almost or completely removed.

Figure 11F:
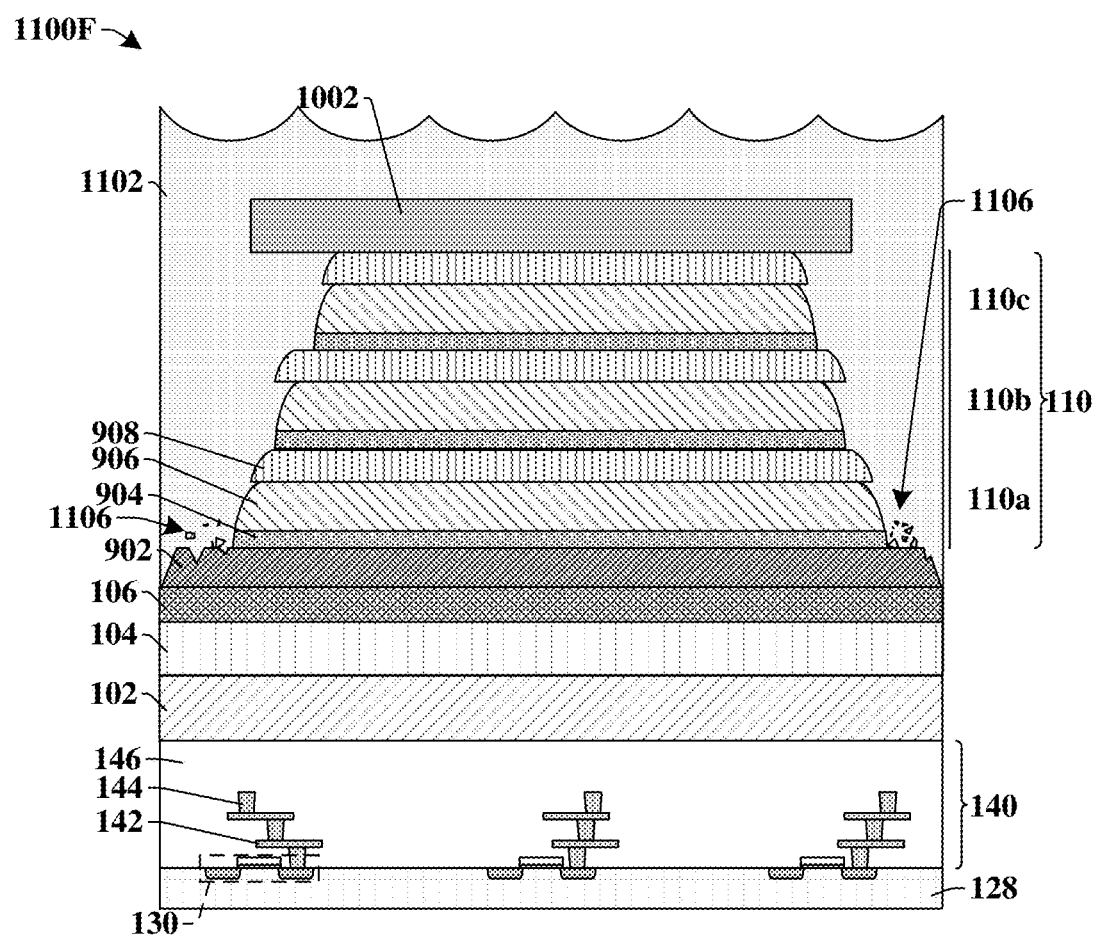

As shown in the cross-sectional view 1100F of FIG. 11F, portions of the first pattern enhancement material 902 begin to be removed by the wet etchant 1102 as the first magnetic structure 110 continues to be exposed and etched by the wet etchant 1102. The wet etchant 1102 also continues to remove the OCZT residue 1106 before the first etch stop layer 106 is exposed. Thus, the first pattern enhancement material 902 gives the wet etching process more time to remove the OCZT residue 1106 before the first etch stop layer 106 is exposed. If the first etch stop layer 106 were exposed before the OCZT residue 1106 was removed, the OCZT residue 1106 would contact and stick to the first etch stop layer 106, negatively impacting the device performance. Increasing the thickness of the first pattern enhancement material 902 and/or choosing a material for the first pattern enhancement material 902 with a slower etch rate increases the time for OCZT residue 1106 removal during the first wet etching process.

Figure 11G:
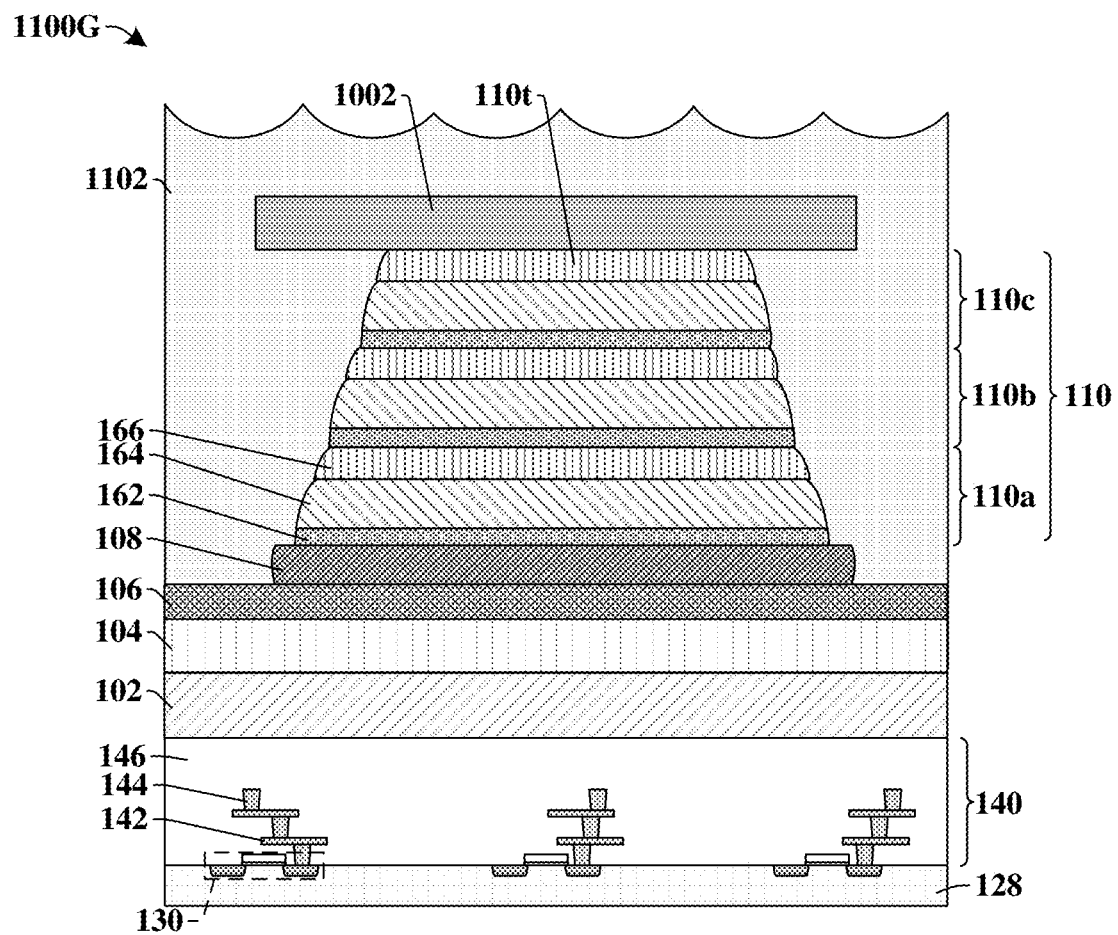

The cross-sectional view 1100G of FIG. 11G may show the first magnetic structure 110 after the first wet etching process is complete. The first magnetic structure 110 comprises layers of a tantalum layer 162, a CZT layer 164, and an OCZT layer 166. A first pattern enhancement layer 108 may be arranged between the first etch stop layer 106 and a lowermost one of the tantalum layer 162. Depending on the etching rate and/or on the etching time of the first wet etching process, the first pattern enhancement layer 108 may be wider than, narrower than, or about equal to a lowermost one of the tantalum layer 162. In some embodiments, the first magnetic structure 110 may have outermost sidewalls that are curved.

In some embodiments, because the first wet etching process comprises the wet etchant 1102, the first magnetic structure 110 and the first pattern enhancement layer 108 will be removed in lateral and vertical directions, and at least a topmost layer 110t of the first magnetic structure 110 may be narrower than the first masking layer 1002. After the first wet etching process, in some embodiments, the first magnetic structure 110 and the first pattern enhancement layer 108 may completely and directly underlie the first masking layer 1002. Further, the first etch stop layer 106 may be resistant to removal by the wet etchant 1102 (e.g., nitric acid and hydrofluoric acid), thereby protecting the underlying layers of the inductor structure (e.g., first passivation layer 102 of FIG. 9, first barrier layer 104 of FIG. 9, etc.). After the first wet etching process, the wet etchant 1102 and the first masking layer 1002 are removed. The first pattern enhancement layer 108 significantly mitigates OCZT residue (1106 of FIG. 11F) on the first etch stop layer 106. Thus, if chemical analysis (e.g., EDX analysis) were to be conducted on the first etch stop layer 106 after the first wet etching process, in some embodiments, OCZT residue (1106 of FIG. 11F), such as CoO precipitates, may not be detected.

Figure 12:
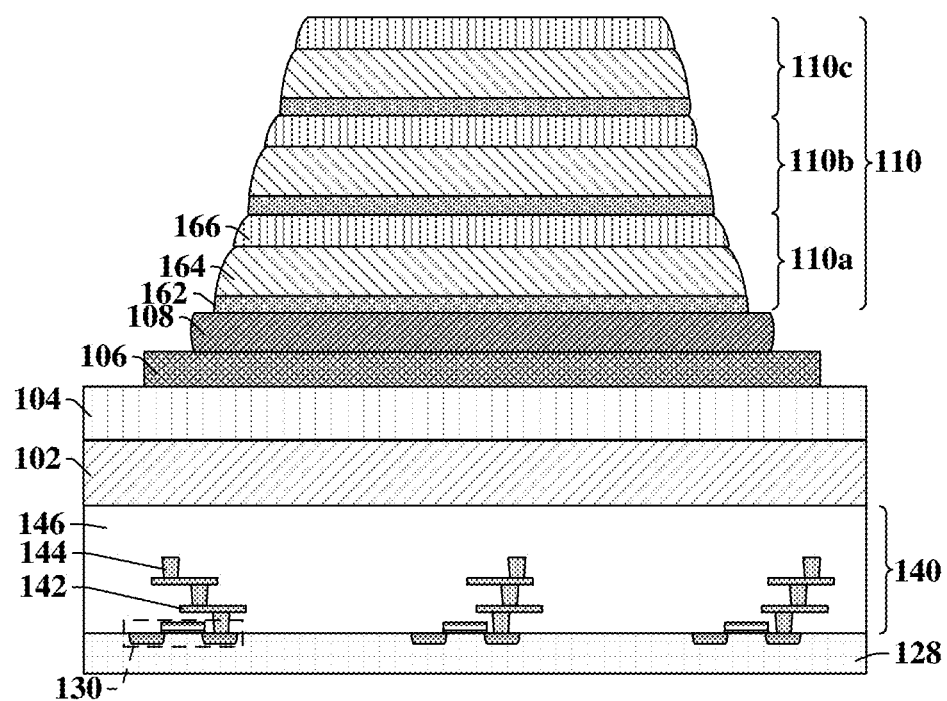

As shown in the cross-sectional view 1200 of FIG. 12, a second etching process may be performed to remove outer portions of the first etch stop layer 106. A second masking layer (not shown) may be formed over the first magnetic structure 110 and/or the first etch stop layer 106, and the second etching process may be performed according to the second masking layer. The second etching process may be a dry etching process in a substantially vertical direction.

In other embodiments (not shown), the second etching process may be omitted, such that the method continues from FIG. 11G to FIG. 13, thereby skipping FIG. 12.

Figure 13:
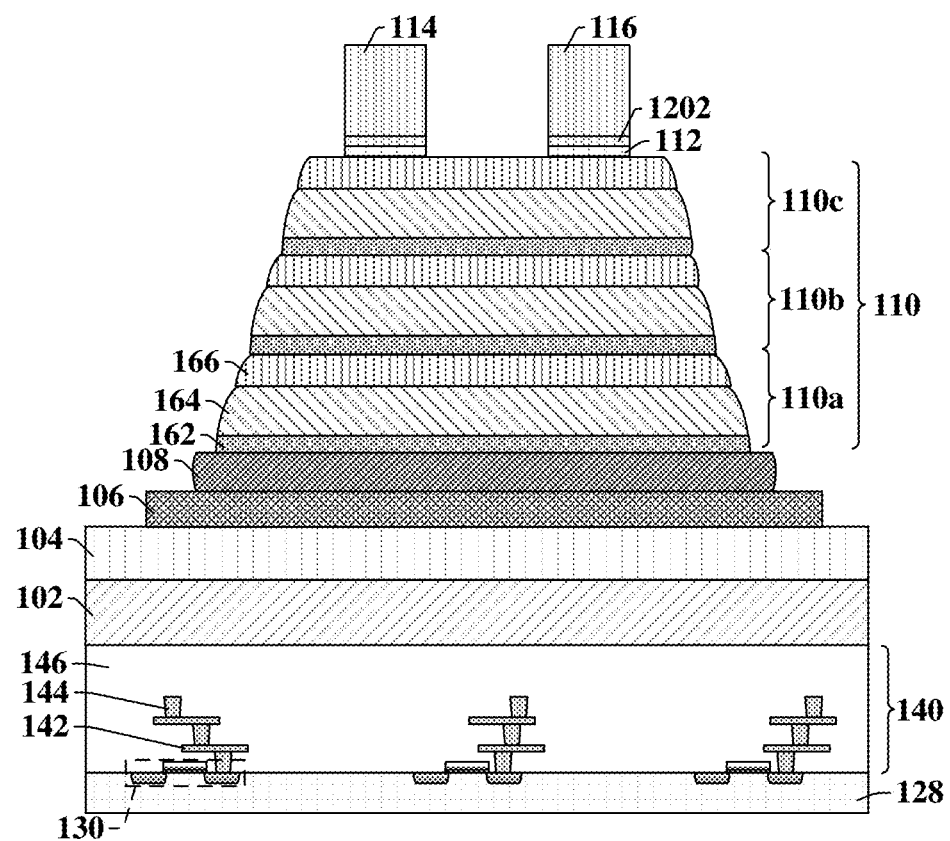

As shown in cross-sectional view 1300 of FIG. 13, a first conductive wire 114 and a second conductive wire 116 may be formed over the first magnetic structure 110. In some embodiments, the first conductive wire 114 and the second conductive wire 116 are laterally spaced apart from one another. A second barrier layer 112 and a seed layer 1202 may separate each of the first and second conductive wires 114, 116 from the first magnetic structure 110. In some embodiments, the second barrier layer 112 may, for example, comprise a dielectric material, such as silicon dioxide, silicon nitride, a low-k dielectric, or some other suitable dielectric material. The second barrier layer 112 may, for example, be deposited or grown by CVD, PVD, ALD, or some other deposition or growth process. In some embodiments, the seed layer 1202 may be formed over the second barrier layer 112. The seed layer 1202 may comprise copper, aluminum, gold, silver, alloy(s) of the foregoing, or other suitable materials. The seed layer 1202 may, for example, be deposited or grown by CVD, PVD, sputtering, electrochemical plating, electroless plating, or some other deposition or growth process. The first and second conductive wires 114, 116 may then be formed over and directly contact the seed layer 1202. The first and second conductive wires 114, 116 may, for example, each comprise copper, aluminum, gold, silver, alloy(s) of the foregoing, or any other suitable conductive material. The first and second conductive wires 114, 116 may, for example, be deposited or grown by CVD, PVD, sputtering, electrochemical plating (ECP), electroless plating, or some other deposition or growth process. In some embodiments, the second barrier layer 112, the seed layer 1202, and/or the first and second conductive wires 114, 116 may be grown or deposited in a patterned photoresist layer, for example, and the patterned photoresist layer may be subsequently removed after such deposition or growth processes.

Figure 14:
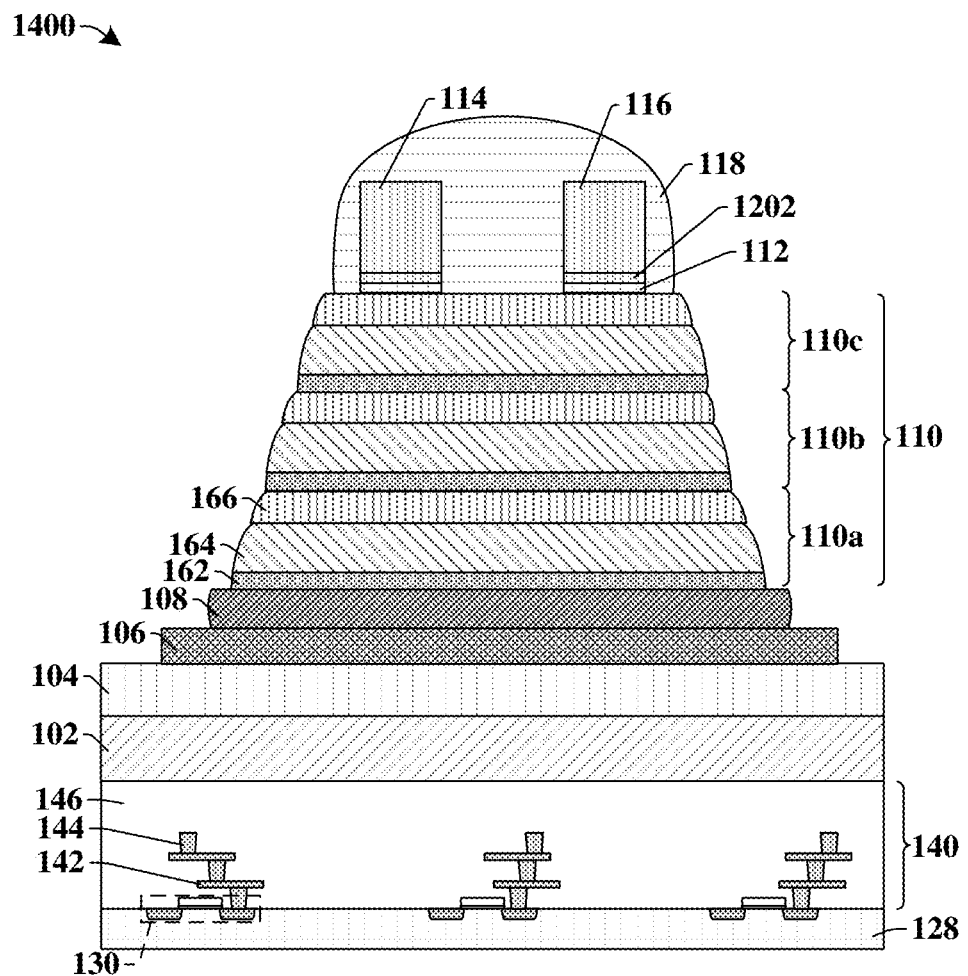

As shown in cross-sectional view 1400 of FIG. 14, a dielectric structure 118 may be deposited over the first magnetic structure 110 and over the first and second conductive wires 114, 116. The dielectric structure 118 is configured to electrically isolate the first and second conductive wires 114, 116 from one another and may comprise, for example, a polyimide compound, a polybenzoxazole compound, or any other suitable dielectric material.

In some embodiments, the dielectric structure 118 may be deposited and/or grown by CVD, PVD, ALD, or another suitable deposition process. In some embodiments, the dielectric structure 118 may be formed by a curing process or a patterning and removal (e.g., etching) process, for example. In some embodiments, the dielectric structure 118 may have a dome-like upper surface. In other embodiments, the dielectric structure may have a substantially flat upper surface by the patterning process (e.g., an etching process) and/or by a planarization process (e.g., a chemical mechanical planarization process). In yet other embodiments, the dielectric structure may have a center portion that is recessed below topmost portions. The center portion is between the first and second conductive wires 114, 116.

Figure 15:
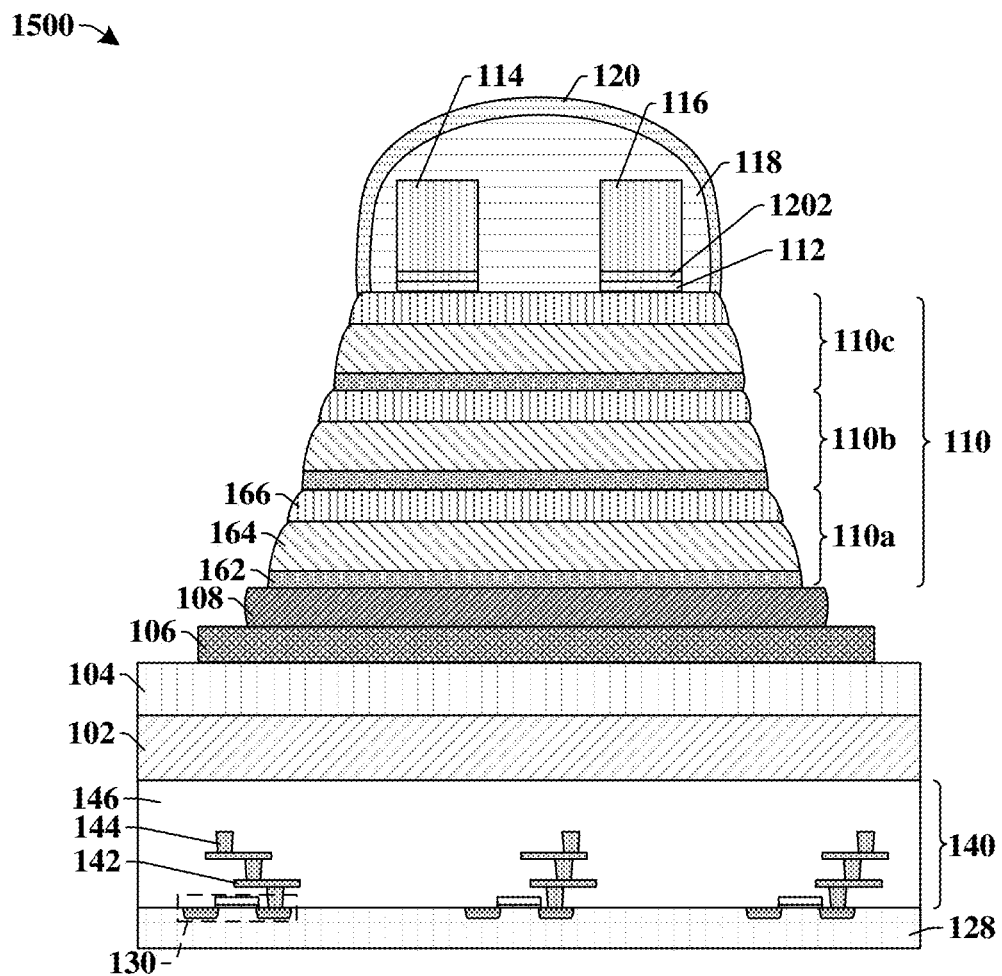

As shown in cross-sectional view 1500 of FIG. 15, a first isolation layer 120 may be formed over the dielectric structure 118. The first isolation layer 120 may, for example, comprise a nitride, silicon nitride, or another suitable dielectric material, and the first isolation layer 120 may be deposited and/or grown by CVD, PVD, ALD, or another suitable deposition process.

Figure 16:
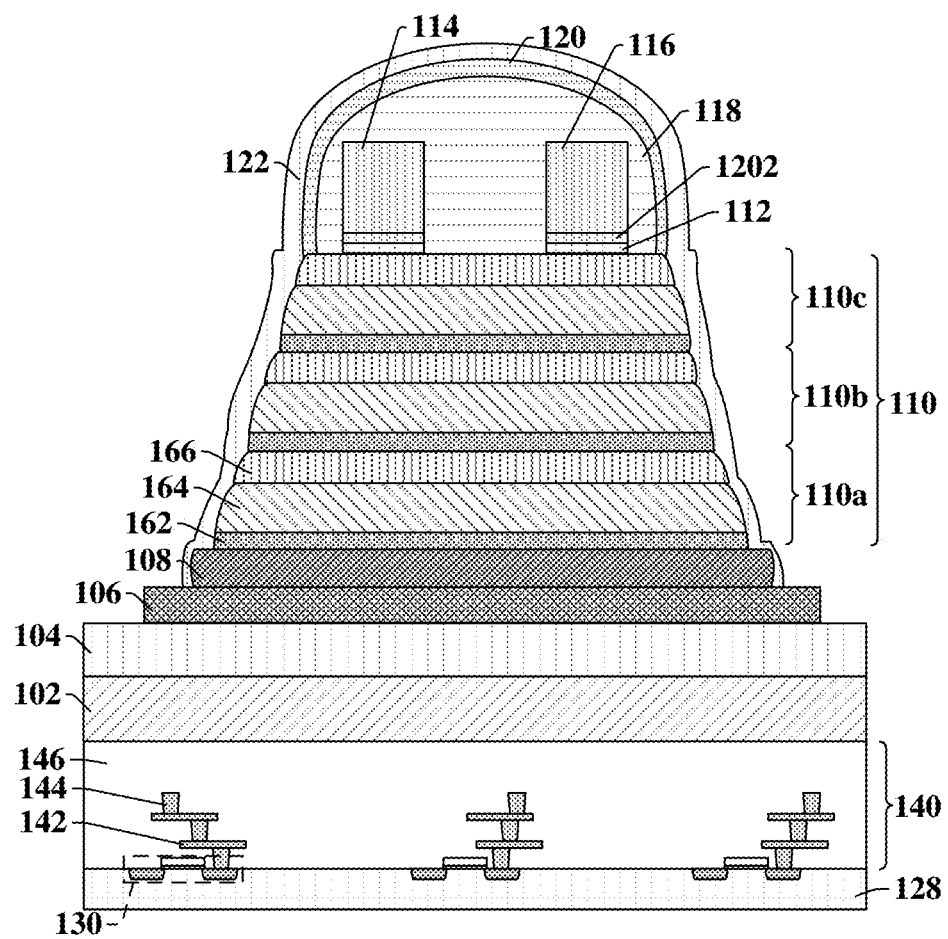

As shown in cross-sectional view 1600 of FIG. 16, a third barrier layer 122 may be formed to overlie the first isolation layer 120 and laterally surround the first magnetic structure 110 and the first pattern enhancement layer 108. The third barrier layer 122 may comprise, for example, silicon nitride, silicon carbide, or the like. In some embodiments, the third barrier layer 122 may be deposited and/or grown by CVD, PVD, ALD, or another suitable deposition process.

Figure 17:
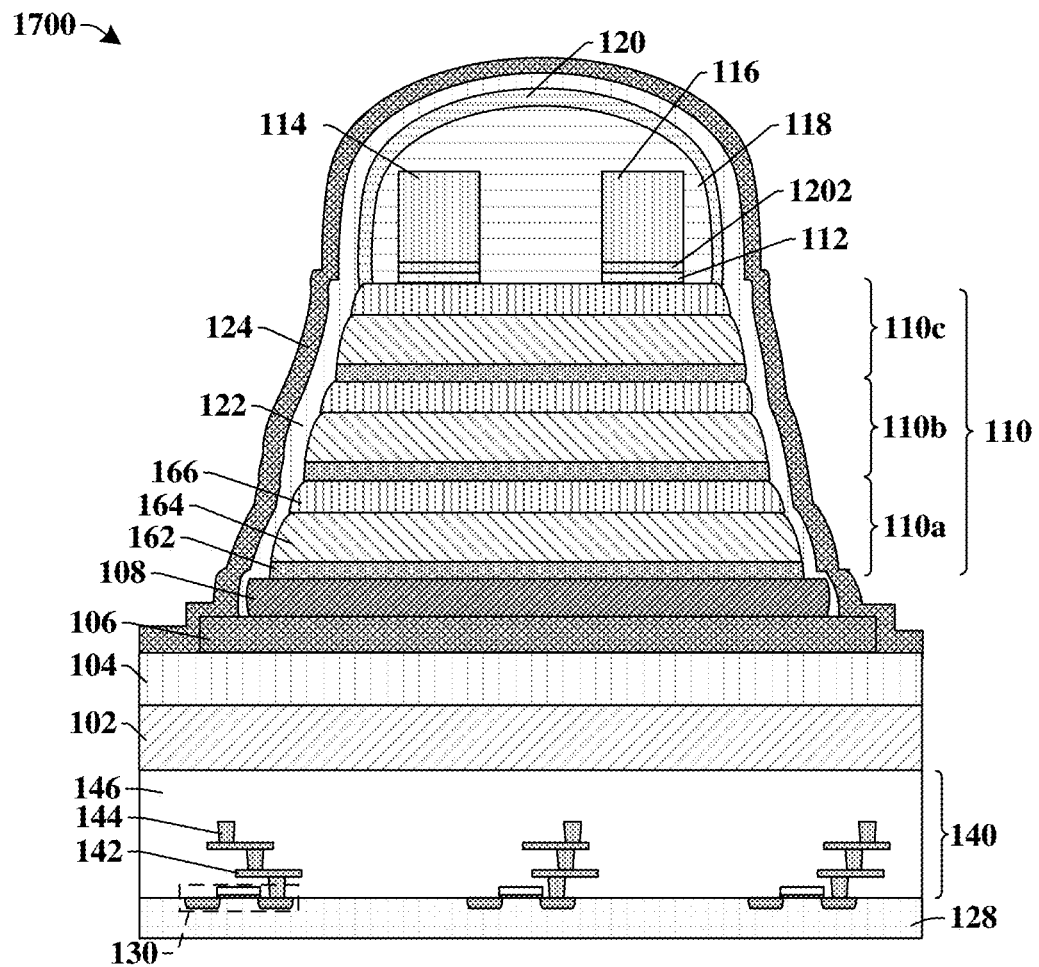

As shown in cross-sectional view 1700 of FIG. 17, a second etch stop layer 124 may be formed over the third barrier layer 122, the first etching stop layer 106, and the first barrier layer 104. In some embodiments, the second etch stop layer 124 may comprise a same material and/or be formed using a same process as the first etch stop layer 106.

Figure 18:
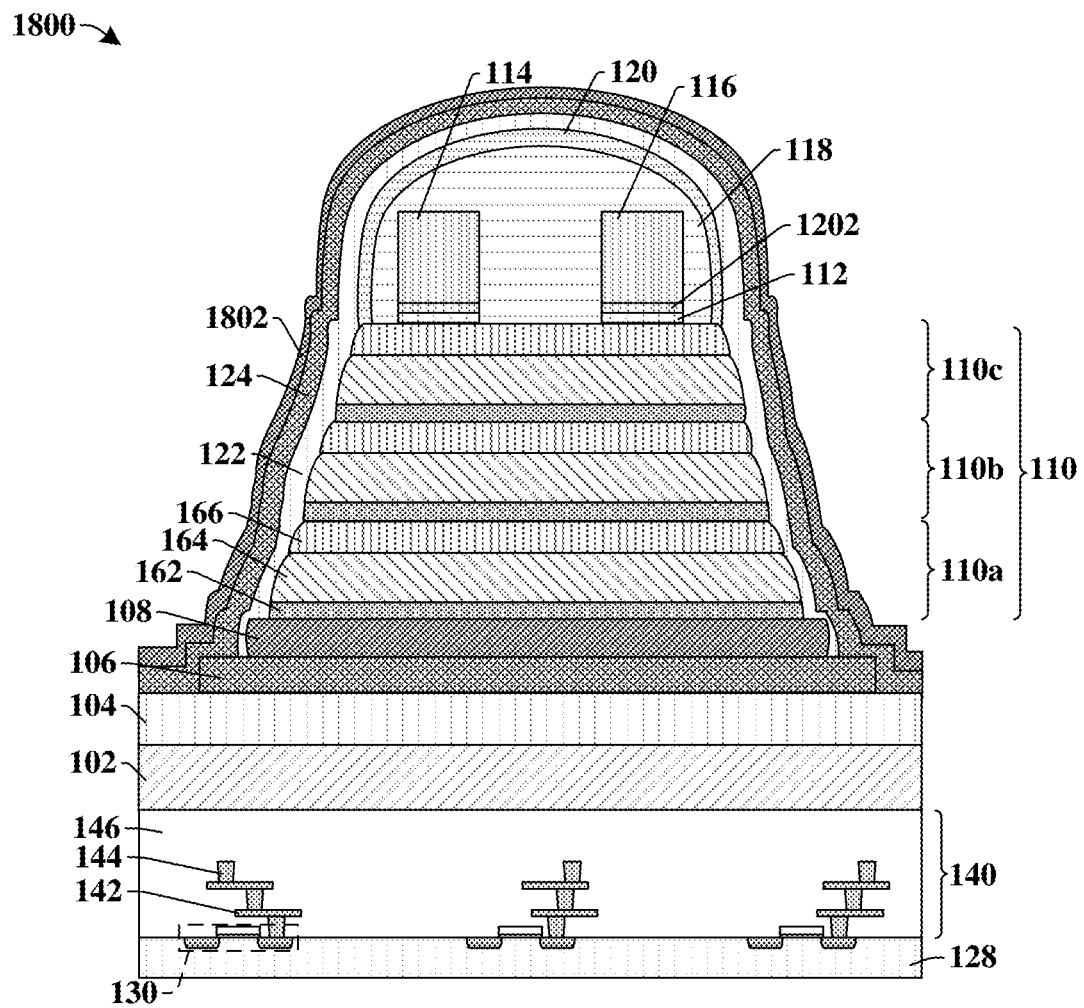

As shown in cross-sectional view 1800 of FIG. 18, in some embodiments, a second pattern enhancement material 1802 may be formed conformally over the second etch stop layer 124. The second pattern enhancement material 1802 may comprise a same or different material than the first pattern enhancement layer 108. In other embodiments, it will be appreciated that the second pattern enhancement material 1802 may be omitted, and that the method may continue from FIG. 17 to FIG. 19, thereby skipping FIG. 18.

Figure 19:
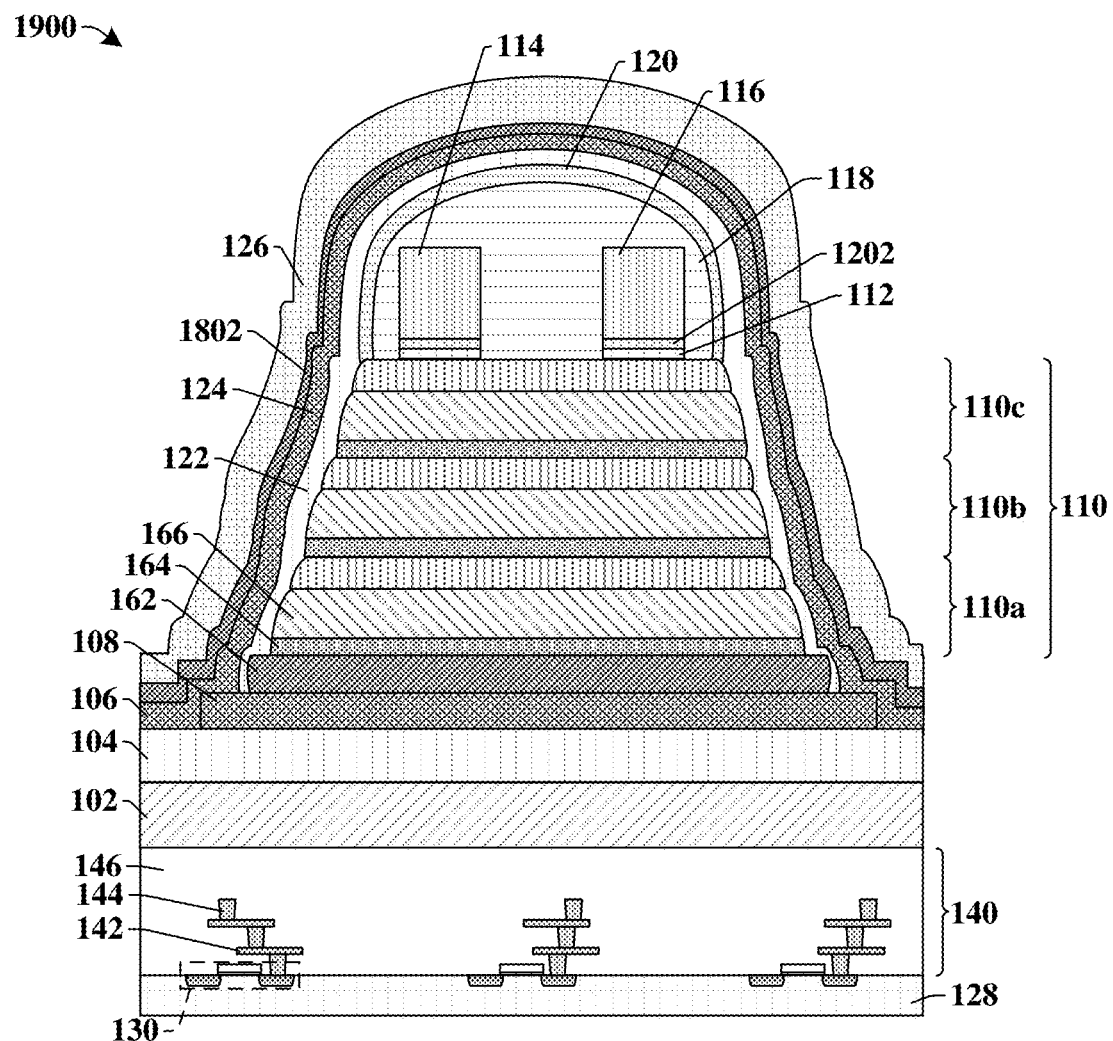

As shown in cross-sectional view 1900 of FIG. 19, in some embodiments, a second magnetic structure 126 may be formed over the second etch stop layer 124, and in some embodiments, over the second pattern enhancement material 1802. In some embodiments, the second magnetic structure 126 comprises a different structure than the first magnetic structure 110. For example, in some embodiments, the second magnetic structure 126 may not comprise oxygen cobalt zinc tantalum. In such embodiments, the second pattern enhancement material 1802 may be omitted. In other embodiments, the second magnetic structure 126 may comprise a same structure as the first magnetic structure 110. In such other embodiments, the second pattern enhancement material 1802 may be present to remove residue formed during patterning of the second magnetic structure 126. In some embodiments, the second pattern enhancement material 1802 and the second magnetic structure 126 may be removed by a same etchant.

Figure 20:
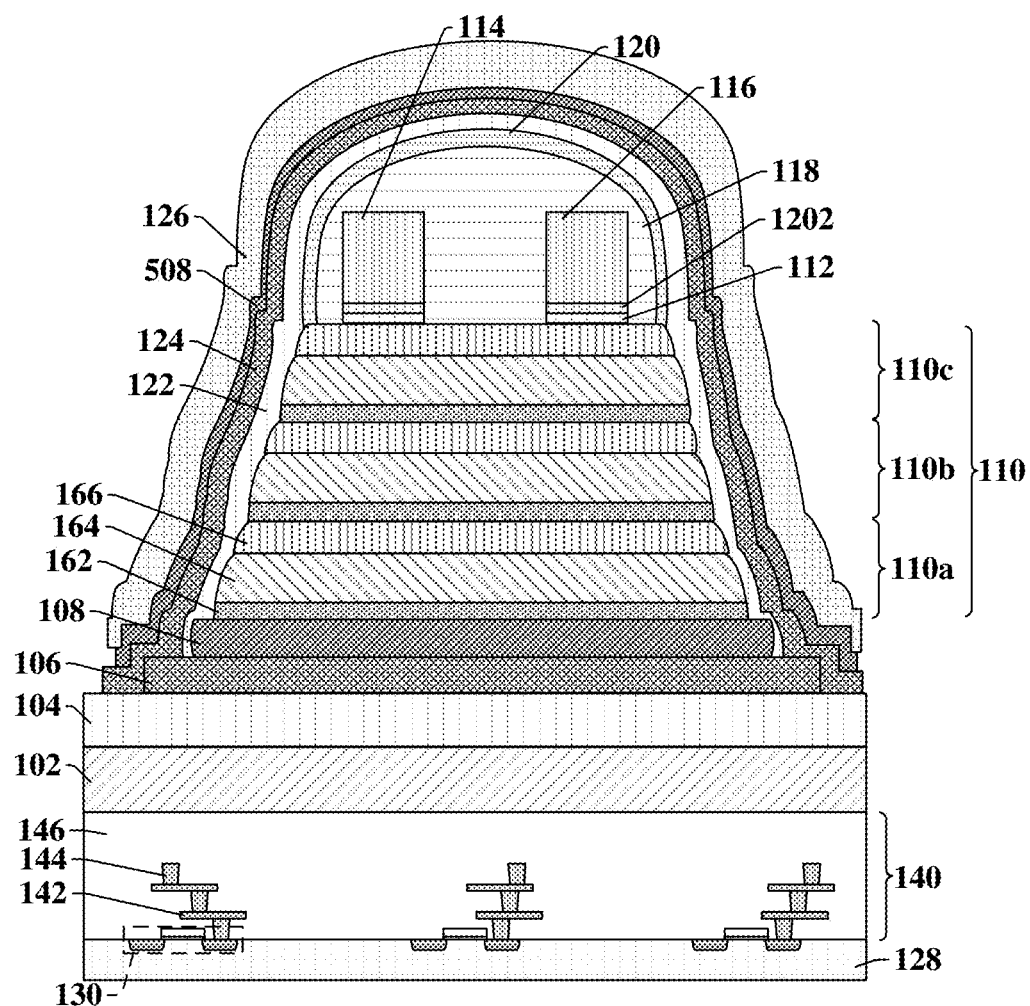

As shown in the cross-sectional view 2000 of FIG. 20, in some embodiments, the second magnetic structure 126 may undergo a third wet etching process to remove outer portions of the second magnetic structure 126. In some embodiments, where during the third wet etching process, outer portions of the second pattern enhancement material (1802 of FIG. 19) may be removed thereby forming a second pattern enhancement layer 508 between the second etch stop layer 124 and the second magnetic structure 126. In such embodiments, the second pattern enhancement layer 508 may allow the third wet etching process to have more space and more time to remove any residue produced by the second magnetic structure 126 during the third wet etching process. In other embodiments, residue is not a side-effect of the third wet etching process, and thus, the second pattern enhancement layer 508 may be omitted. Further, in some embodiments, the third wet etching process may be followed by a fourth etching process to remove outer portions of the second etch stop layer 124.

It will be appreciated that prevention of residue formation on the second etch stop layer 124 by the second pattern enhancement layer 508 during the third wet etching process may involve a similar mechanism as depicted in FIGS. 11A-11G with respect to the prevention of OCZT residue (1106 of FIG. 11B) on the first etch stop layer 106 by the first pattern enhancement layer 108 during the first wet etching process.

Nevertheless, due to the first and/or second pattern enhancement layers 108, 508, residue (e.g., OCZT residue 1106 of FIG. 11F) between layers of the inductor structure may be mitigated such that the first and second magnetic structures 110, 126 reliably surround the first and second conductive wires 114, 116.

Figure 21:
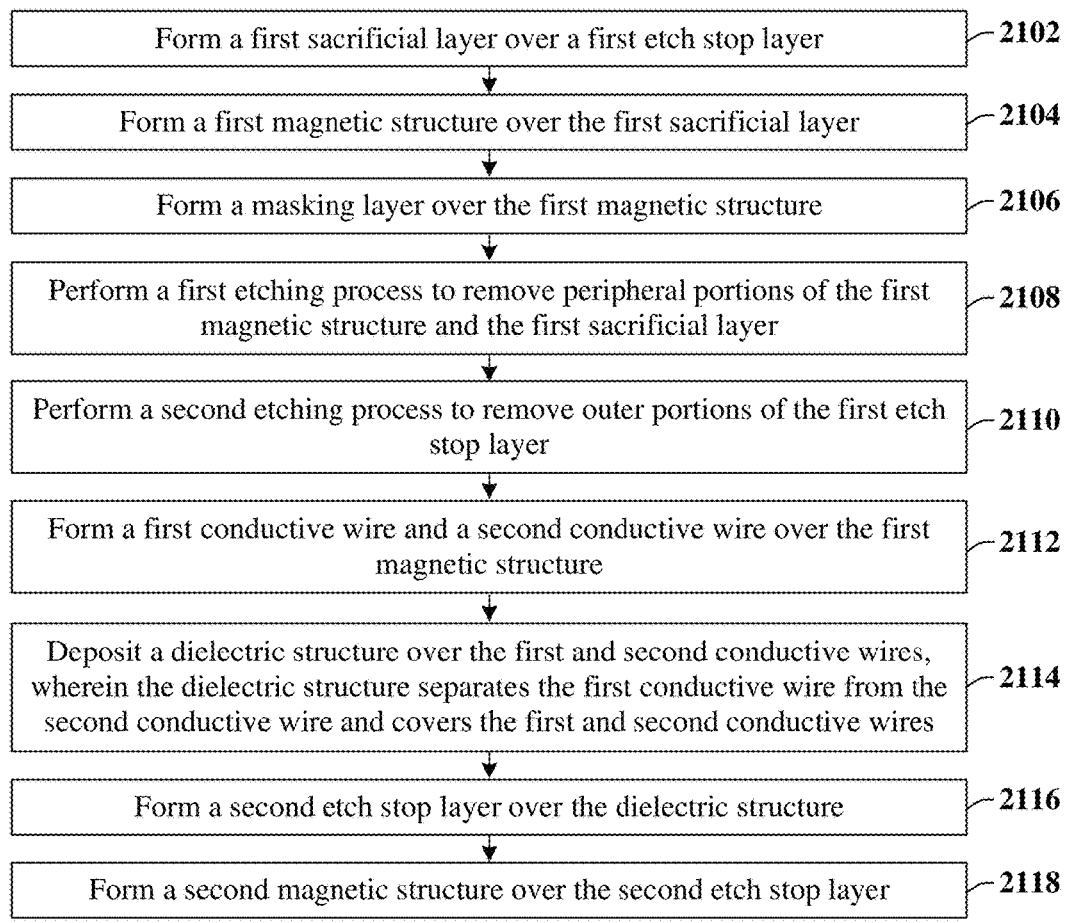
FIG. 21 illustrates a flow diagram of some embodiments of the method illustrated in FIGS. 9-20.

FIG. 21 illustrates a flow diagram of some embodiments of a method 2100 of forming inductor structure having a first pattern enhancement layer arranged between a first magnetic structure and a first etch stop layer.

While method 2100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2102, a first pattern enhancement layer is formed over a first etch stop layer.

At act 2104, a first magnetic structure is formed over the first pattern enhancement layer. FIG. 9 illustrates a cross-sectional view 900 of some embodiments corresponding to acts 2102 and 2104.

At act 2106, a masking layer is formed over the first magnetic structure. FIG. 10 illustrates a cross-sectional view 1000 of some embodiments corresponding to act 2106.

At act 2108, a first etching process is performed to remove peripheral portions of the first magnetic structure and the first pattern enhancement layer. FIGS. 11A and 8G illustrate cross-sectional views 1100A and 1100B, respectively, of some embodiments corresponding to act 2108.

At act 2110, a second etching process is performed to remove outer portions of the first etch stop layer. FIG. 12 illustrates cross-sectional view 1200 of some embodiments corresponding to act 2110.

At act 2112, a first conductive wire and a second conductive wire are formed over the first magnetic structure. FIG. 13 illustrates cross-sectional view 1300 of some embodiments corresponding to act 2112.

At act 2114, a dielectric structure is deposited over the first and second conductive wires, wherein the dielectric structure separates the first conductive wire from the second conductive wire and covers the first and second conductive wires. FIG. 14 illustrates cross-sectional view 1400 of some embodiments corresponding to act 2114.

At act 2116, a second etch stop layer is formed over the dielectric structure. FIG. 17 illustrates cross-sectional view 1700 of some embodiments corresponding to act 2116.

At act 2118, a second magnetic structure is formed over the second etch stop layer. FIG. 19 illustrates cross-sectional view 1900 of some embodiments corresponding to act 2118.

Therefore, the present disclosure relates to a new method of manufacturing an inductor structure having a first pattern enhancement layer arranged between a first magnetic structure and a first etch stop layer to mitigate the presence of residue upon patterning the first magnetic structure.

Accordingly, in some embodiments, the present disclosure relates to an inductor structure, comprising: an etch stop layer arranged over an interconnect structure overlying a substrate; a magnetic structure comprising a plurality of stacked layers arranged over the etch stop layer, the magnetic structure comprising a bottommost layer that is wider than a topmost layer; a first conductive wire and a second conductive wire extending in parallel over the magnetic structure, wherein the magnetic structure is configured to modify magnetic field generated by the first conductive wire and the second conductive wire; and a pattern enhancement layer arranged between the bottommost layer of the magnetic structure and the etch stop layer, wherein the pattern enhancement layer has a first thickness, and wherein the bottommost layer of the magnetic structure has a second thickness less than the first thickness.

In other embodiments, the present disclosure relates to an inductor structure, comprising: an interconnect structure disposed over a semiconductor substrate; a first etch stop layer arranged over the interconnect structure; a first magnetic structure arranged over the first etch stop layer, the first magnetic structure comprising a cobalt zinc tantalum (CZT) layer between a lowermost tantalum layer and a topmost oxygen-CZT layer; one or more conductive wires disposed over the first magnetic structure and defining an inductor; and a pattern enhancement layer arranged between the lowermost tantalum layer and the first etch stop layer.

In yet other embodiments, the present disclosure relates to a method of forming an inductor structure, comprising: forming a first pattern enhancement layer over a first etch stop layer; forming a magnetic structure over the first pattern enhancement layer, wherein the magnetic structure comprises layers of oxygen cobalt zinc tantalum (OCZT) material, layers of tantalum material, and layers of cobalt zinc tantalum (CZT) material, wherein the first pattern enhancement layer directly contacts one of the layers of tantalum material; and performing a first etching process to remove peripheral portions of the magnetic structure and the first pattern enhancement layer, wherein the magnetic structure and the first pattern enhancement layer are etched by a same etchant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An inductor structure, comprising:
an interconnect structure over a substrate;
an etch stop layer over the interconnect structure;
a magnetic structure comprising a plurality of stacked layers over the etch stop layer, wherein the magnetic structure comprises a bottommost layer that is wider than a topmost layer;
a first conductive wire and a second conductive wire extending in parallel over the magnetic structure, wherein the magnetic structure is configured to modify magnetic fields generated by the first conductive wire and the second conductive wire; and
a pattern enhancement layer between the bottommost layer of the magnetic structure and the etch stop layer, wherein the pattern enhancement layer has a first thickness, and wherein the bottommost layer of the magnetic structure has a second thickness less than the first thickness.

2. The inductor structure of claim 1, wherein the bottommost layer of the magnetic structure comprises tantalum and the topmost layer of the magnetic structure comprises oxygen cobalt zinc tantalum.

3. The inductor structure of claim 1, wherein the pattern enhancement layer has a bottom surface that directly contacts the etch stop layer and that has a first width, wherein the bottommost layer of the magnetic structure has a bottom surface that directly contacts the pattern enhancement layer and that has a second width greater than the first width.

4. The inductor structure of claim 1, wherein the pattern enhancement layer has a bottom surface that directly contacts the etch stop layer and that has a first width, wherein the bottommost layer of the magnetic structure has a bottom surface that directly contacts the pattern enhancement layer and that has a second width less than the first width.

5. The inductor structure of claim 1, wherein the pattern enhancement layer comprises less than 10 percent oxygen.

6. The inductor structure of claim 1, wherein the pattern enhancement layer comprises one or more of the following: tantalum, silicon nitride, titanium, tungsten, nickel, zirconium, silicon germanium, tin, niobium, vanadium, or indium antimony.

7. The inductor structure of claim 1, wherein the topmost layer of the magnetic structure comprises oxygen cobalt zinc tantalum, and wherein an etch rate of the pattern enhancement layer is faster than the topmost layer of the magnetic structure.

8. The inductor structure of claim 1, wherein the interconnect structure comprises a plurality of interconnect layers within a dielectric structure and a bond pad over the plurality of interconnect layers, and wherein the etch stop layer is vertically above the bond pad.

9. An inductor structure, comprising:
   an interconnect structure over a semiconductor substrate;
   a first etch stop layer over the interconnect structure;
   a first magnetic structure over the first etch stop layer, wherein the first magnetic structure comprises a cobalt zinc tantalum (CZT) layer between a lowermost tantalum layer and a topmost oxygen-CZT layer;
   one or more conductive wires over the first magnetic structure and defining an inductor; and
   a pattern enhancement layer between the lowermost tantalum layer and the first etch stop layer.

10. The inductor structure of claim 9, wherein the pattern enhancement layer has a top surface having a first width, wherein the lowermost tantalum layer has a bottom surface having a second width that is less than the first width, and wherein the top surface of the pattern enhancement layer directly contacts the bottom surface of the lowermost tantalum layer.

11. The inductor structure of claim 9, wherein the pattern enhancement layer has a top surface having a first width, wherein the lowermost tantalum layer has a bottom surface having a second width that is greater than the first width, and wherein the top surface of the pattern enhancement layer directly contacts the bottom surface of the lowermost tantalum layer.

12. The inductor structure of claim 9, wherein the pattern enhancement layer has a first etch rate when exposed to a wet etchant, wherein the topmost oxygen-CZT layer has a second etch rate when exposed to the wet etchant, and wherein the first etch rate is greater than the second etch rate.

13. The inductor structure of claim 9, further comprising:
   a first conductive wire over the first magnetic structure;
   a second conductive wire over the first magnetic structure and laterally spaced from the first conductive wire;
   a dielectric layer over and between the first and second conductive wires;
   a second etch stop layer over the dielectric layer; and
   a second magnetic structure over the second etch stop layer.

14. The inductor structure of claim 13, further comprising:
   a second pattern enhancement layer between the second etch stop layer and the second magnetic structure.

15. The inductor structure of claim 14, wherein the second pattern enhancement layer comprises topmost portions that directly overlie the first conductive wire and the second conductive wire, wherein the second pattern enhancement layer comprises a center portion between the first and second conductive wires, and wherein the center portion is recessed below the topmost portions of the second pattern enhancement layer.

16. An inductor structure, comprising:
   an interconnect structure over a substrate;
   a first magnetic structure over the interconnect structure and comprising a first plurality of stacked layers;
   a first conductive wire and a second conductive wire extending in parallel over the first magnetic structure;
   an etch stop layer over the first conductive wire and the second conductive wire;
   a second magnetic structure over the etch stop layer and comprising a second plurality of stacked layers; and
   a pattern enhancement layer between and directly contacting the second magnetic structure and the etch stop layer.

17. The inductor structure according to claim 16, wherein the second magnetic structure comprises a cobalt zinc tantalum (CZT) layer between a lowermost tantalum layer and a topmost oxygen-CZT layer.

18. The inductor structure according to claim 17, wherein the pattern enhancement layer is a metal oxide and directly contacts the lowermost tantalum layer.

19. The inductor structure according to claim 16, further comprising:
   an additional etch stop layer over the interconnect structure, wherein the first magnetic structure is over the additional etch stop layer; and
   an additional pattern enhancement layer between and directly contacting the additional etch stop layer and the first magnetic structure.

20. The inductor structure according to claim 16, wherein the second magnetic structure and the pattern enhancement layer have individual sidewalls that border each other and that face a common direction, and wherein the individual sidewalls are laterally offset from each other.

* * * * *